US009228073B2

(12) United States Patent
He et al.

(10) Patent No.: US 9,228,073 B2
(45) Date of Patent: Jan. 5, 2016

(54) STABILIZED MATRIX-FILLED LIQUID RADIATION CURABLE RESIN COMPOSITIONS FOR ADDITIVE FABRICATION

(71) Applicant: DSM IP Assets B.V., Heerlen (NL)

(72) Inventors: Mingbo He, Gilberts, IL (US); Beth Rundlett, West Des Moines, IA (US); Kangtai Ren, Geneva, IL (US); Caroline Liu, Barrington, IL (US); Tai Yeon Lee, Crystal Lake, IL (US)

(73) Assignee: DSM IP Assets B.V., Heerlen (NL)

( * ) Notice: Subject to any disclaimer, the term of this patent is extended or adjusted under 35 U.S.C. 154(b) by 0 days.

(21) Appl. No.: 14/533,238

(22) Filed: Nov. 5, 2014

(65) Prior Publication Data

US 2015/0125702 A1   May 7, 2015

Related U.S. Application Data

(60) Provisional application No. 61/900,044, filed on Nov. 5, 2013, provisional application No. 62/074,735, filed on Nov. 4, 2014.

(51) Int. Cl.
| | |
|---|---|
| C08F 2/46 | (2006.01) |
| C08G 61/04 | (2006.01) |
| C08K 3/36 | (2006.01) |
| C08L 33/10 | (2006.01) |
| G03F 7/00 | (2006.01) |
| G03F 7/004 | (2006.01) |
| G03F 7/038 | (2006.01) |
| B29C 67/00 | (2006.01) |
| C08F 2/50 | (2006.01) |
| C08F 222/10 | (2006.01) |
| B33Y 70/00 | (2015.01) |
| B29K 63/00 | (2006.01) |
| B29K 105/00 | (2006.01) |
| B29K 105/24 | (2006.01) |
| B29K 509/02 | (2006.01) |

(52) U.S. Cl.
CPC ............... *C08K 3/36* (2013.01); *B29C 67/0066* (2013.01); *C08F 2/50* (2013.01); *C08F 222/1006* (2013.01); *C08L 33/10* (2013.01); *G03F 7/0037* (2013.01); *G03F 7/0047* (2013.01); *G03F 7/038* (2013.01); *B29K 2063/00* (2013.01); *B29K 2105/0088* (2013.01); *B29K 2105/246* (2013.01); *B29K 2509/02* (2013.01); *B33Y 70/00* (2014.12); *C08K 2201/011* (2013.01); *Y10T 428/31511* (2015.04)

(58) Field of Classification Search
CPC .... C08K 3/36; C08K 2201/011; B33Y 70/00; G03F 7/0037; G03F 7/038; G03F 7/0047; C08F 2/50; B29C 67/0066; B29K 2063/00; B29K 2105/0088; B29K 2509/02; B29K 2105/246; C08L 33/10

USPC .................................................. 522/1; 520/1
See application file for complete search history.

(56) References Cited

U.S. PATENT DOCUMENTS

| | | | |
|---|---|---|---|
| 5,648,407 A | 7/1997 | Goetz et al. | |
| 5,972,563 A * | 10/1999 | Steinmann et al. | 430/280.1 |
| 5,989,475 A | 11/1999 | Schulthess et al. | |
| 6,001,298 A | 12/1999 | McAloon | |
| 6,013,714 A * | 1/2000 | Haruta et al. | 524/492 |
| 6,177,232 B1 * | 1/2001 | Melisaris et al. | 430/280.1 |
| 6,287,745 B1 * | 9/2001 | Yamamura et al. | 430/269 |
| 6,350,403 B1 * | 2/2002 | Melisaris et al. | 264/401 |
| 6,742,456 B1 | 6/2004 | Kasperchik et al. | |
| 8,617,787 B2 * | 12/2013 | Suzuki et al. | 430/270.1 |
| 2002/0045126 A1 * | 4/2002 | Watanabe et al. | 430/280.1 |
| 2003/0207959 A1 | 11/2003 | Napadensky et al. | |
| 2004/0023145 A1 * | 2/2004 | Moussa et al. | 430/138 |
| 2004/0077745 A1 * | 4/2004 | Xu | 522/170 |
| 2005/0040562 A1 | 2/2005 | Steinmann et al. | |
| 2005/0101684 A1 * | 5/2005 | You et al. | 522/1 |
| 2006/0267252 A1 | 11/2006 | Steinmann et al. | |

(Continued)

FOREIGN PATENT DOCUMENTS

| | | |
|---|---|---|
| EP | 0998695 | 5/2000 |
| EP | 0831373 | 1/2004 |
| EP | 1508834 | 2/2005 |

OTHER PUBLICATIONS

Richard D Sudduth, A New Method to Predict the Maximum Packing Fraction and the Viscosity of Solutions with a Size Distribution of Suspended Particles. Journal of Applied Polymer Science, vol. 48, 37-55 (1993).

(Continued)

*Primary Examiner* — Ling Choi
*Assistant Examiner* — Jessica E Whiteley
(74) *Attorney, Agent, or Firm* — Daniel S. Bujas

(57) ABSTRACT

Matrix-filled liquid radiation curable resin compositions for additive fabrication are described and claimed. Such resins include a cationically polymerizable component that is an aliphatic epoxide, a multifunctional (meth)acrylate component, a cationic photoinitiator, a free-radical photo initiator, and a matrix of inorganic fillers, wherein the matrix further constitutes prescribed ratios of at least one microparticle constituent and at least one nanoparticle constituent. Also described and claimed is a process for using the matrix-filled liquid radiation curable resins for additive fabrication to create three dimensional parts, and the three-dimensional parts made from the liquid radiation curable resins for additive fabrication.

26 Claims, 2 Drawing Sheets

(56) References Cited

U.S. PATENT DOCUMENTS

2008/0306203 A1    12/2008    Adam et al.
2012/0251841 A1*   10/2012    Southwell et al. ............ 428/704

OTHER PUBLICATIONS

Shuji Yamada, Jinko Kanno, Miki Miyauchi, Multi-Sized Sphere Packing, Department of Computer Science, Kyoto Sangyo University, Japan, Mathematics and Statistics Program, Louisiana Tech University, U.S.A, Innovative Communication Lab, NTT Communication Science Labs, Japan, Jul. 4, 2009.

Material Safety Data Sheet, NANOPOX(R) A Products, EVONIK Industries,/2013.

Making the connection—particle size, size distribution and rheology; Jamie Fletcher, Applications Specialist, Adrian Hill, Rheometry Technical Specialist, Malvern Instruments Ltd., Enigma Business Park, Grovewood Road, Malvern, Worcestershire, UK, WR14 1XZ, Chemeurope.com/whitepapers/61207.

The effect of particle sizes and solids concentration on the rheology of silica sand based suspensions. N. Magesana, R.S. Chikuku, A.N. Mainza, I. Govender, A.P. van der Westhuizen, and M. Narashima. The Journal of the Southern Afridcan Institute of Mining and Metalurgy, vol. 108, Apr. 2008, pp. 237-243.

* cited by examiner

STABILIZED MATRIX-FILLED LIQUID RADIATION CURABLE RESIN COMPOSITIONS FOR ADDITIVE FABRICATION

TECHNICAL FIELD

The present invention relates to matrix-filled liquid radiation curable compositions for additive fabrication processes.

CROSS-REFERENCE TO RELATED APPLICATIONS

This application claims priority to U.S. Provisional Applications No. 61/900,044 filed 5 Nov. 2013 and No. 62/074,735 filed 4 Nov. 2014, each of which are hereby incorporated by reference in their entirety as if fully set forth herein.

BACKGROUND

Additive fabrication processes for producing three dimensional objects are well known. Additive fabrication processes utilize computer-aided design (CAD) data of an object to build three-dimensional parts. These three-dimensional parts may be formed from liquid resins, powders, or other materials.

A non-limiting example of an additive fabrication process is stereolithography (SL). Stereolithography is a well-known process for rapidly producing models, prototypes, patterns, and production parts in certain applications. SL uses CAD data of an object wherein the data is transformed into thin cross-sections of a three-dimensional object. The data is loaded into a computer which controls a laser that traces a pattern of a cross section through a liquid radiation curable resin composition contained in a vat, solidifying a thin layer of the resin corresponding to the cross section. The solidified layer is recoated with resin and the laser traces another cross section to harden another layer of resin on top of the previous layer. The process is repeated layer by layer until the three-dimensional object is completed. When initially formed, the three-dimensional object is, in general, not fully cured, and is called a "green model." Although not required, the green model may be subjected to post-curing to enhance the mechanical properties of the finished part. An example of an SL process is described in U.S. Pat. No. 4,575,330, which is hereby incorporated by reference.

There are several types of lasers used in stereo lithography, traditionally ranging from 193 nm to 355 nm in wavelength, although other wavelength variants exist. The use of gas lasers to cure liquid radiation curable resin compositions is well known. The delivery of laser energy in a stereolithography system can be Continuous Wave (CW) or Q-switched pulses. CW lasers provide continuous laser energy and can be used in a high speed scanning process. However, their output power is limited which reduces the amount of curing that occurs during object creation. As a result the finished object will need additional post process curing. In addition, excess heat could be generated at the point of irradiation which may be detrimental to the resin. Further, the use of a laser requires scanning point by point on the resin which can be time-consuming.

Other methods of additive fabrication utilize lamps or light emitting diodes (LEDs). LEDs are semiconductor devices which utilize the phenomenon of electroluminescence to generate light. At present, LED UV light sources currently emit light at wavelengths between 300 and 475 nm, with 365 nm, 390 nm, 395 nm, 405 nm, and 415 nm being common peak spectral outputs. See textbook, "Light-Emitting Diodes" by E. Fred Schubert, $2^{nd}$ Edition, © E. Fred Schubert 2006, published by Cambridge University Press, for a more in-depth discussion of LED UV light sources.

Many additive fabrication applications require a freshly-cured part, aka the "green model" to possess high mechanical strength (modulus of elasticity, fracture strength). This property, often referred to as "green strength," constitutes an important property of the green model and is determined essentially by the nature of the liquid radiation curable resin composition employed in combination with the type of apparatus used and degree of exposure provided during part fabrication. Other important properties of a stereolithographic resin composition include a high sensitivity for the radiation employed in the course of curing and a minimum amount of curl or shrinkage deformation, permitting high shape definition of the green model. Of course, not only the green model but also the final cured article should have sufficiently optimized mechanical properties.

For select additive fabrication applications in the aerospace or automotive industries, for example, three-dimensional solid parts are subjected to the high force loads of a wind tunnel, or the extreme temperatures of a location proximate to heat-generating componentry. In such applications, designers and engineers require a three-dimensional solid part created via additive fabrication to maintain its structural integrity and minimize deflection. Thus three-dimensional parts made from photopolymerizable compositions must possess ceramic-like material properties, such as high strength, stiffness, and heat resistance.

"Filled" liquid radiation curable resins have long been used in the field in an attempt to meet these specialized application design criteria. That is, high amounts of inorganic filler, such as silica ($SiO_2$) have been imparted into traditional "unfilled" liquid radiation curable resins due to the filler's positive impact on the strength and stiffness of the three-dimensional object produced therefrom. Such filled liquid radiation curable compositions are known in the art of additive fabrication, and are disclosed in, e.g., U.S. Pat. No. 5,972,563 (Issued Oct. 26, 1999), U.S. Pat. No. 5,989,475 (Issued Nov. 23, 1999), U.S. Pat. No. 6,287,745 (Issued Sep. 11, 2001), U.S. Pat. No. 6,742,456 (Issued Jun. 1, 2004), U.S. Pat. Pub. No. 20020045126, U.S. Pat. Pub. No. 20040077745, and U.S. Pat. Pub. No. 20050101684, all of which are hereby incorporated by reference. While the aforementioned patents disclose fundamental filled liquid radiation curable compositions, none discuss or teach compositions sufficiently and simultaneously overcoming the several drawbacks typically associated with their use.

Thus, highly filled compositions present several challenges to the formulator of liquid radiation curable resins for additive fabrication. Heretofore no filled liquid radiation curable composition for additive fabrication existed that could both yield three-dimensional parts possessing excellent mechanical properties, yet simultaneously avoid: (1) a high initial viscosity, (2) a poor viscosity stability, and (3) a tendency to phase separate, resulting in phenomena known as either "soft pack" or "hard pack."

The first long-felt problem with filled liquid radiation curable resin compositions for additive fabrication is that as the amount of filler increases, the viscosity of the resin also usually increases, resulting in decreased workability and processing speed. Highly viscous resins particularly retard the processing speed in vat-based additive fabrication systems such as stereolithography. Existing resins are sufficiently flow-resistant such that they will not readily form a smooth layer of liquid photo curable resin over the just formed solid layer to ensure accurate cure by actinic radiation. Consequently, a recoating operation has traditionally been used to simultaneously place and mechanically smooth a fresh layer of resin over a previously cured layer prior to exposure with actinic radiation. In one non-limiting example, this recoating operation has traditionally been performed by means of a "recoating blade." A recoating blade design is discussed in, for example, Chapman et al., U.S. Pat. No. 5,626,919, assigned to DSM IP Assets, B.V.

Even with a recoating operation, however, low viscosity remains an important characteristic of the resin. The filled liquid radiation curable resin composition's viscosity affects the time it takes to equilibrate as a smooth, even surface after the recoating step. Consequently, a programmed "dwell time" has been traditionally used between the end of the recoating operation and the beginning of the exposure of the next layer of resin to appropriate imaging radiation. Both the recoating operation and the dwell time dramatically increase the process time of a typical vat-based additive fabrication process.

Additionally, the viscosity of the liquid radiation curable resin also affects the time and difficulty associated with preparing a recently-cured part for post processing operations. In a vat-based additive fabrication process, upon build completion of a three-dimensional solid part, the solidified portions are removed from the liquid uncured resin. A highly viscous resin will be more difficult to separate from the cured part, wherein a resin of substantially low viscosity will be removed without significant effort. Thus, low viscosity resins reduce the time required to clean a part in order to prepare it for post processing operations.

Second, while the importance of filled liquid radiation curable compositions for additive fabrication with a sufficiently low initial viscosity is significant, it is equally as important to conduct additive fabrication processes with a resin having sufficient viscosity stability over time. Filled liquid radiation curable resins for additive fabrication possess a well-known amplified tendency to increase in viscosity over time than versus traditional unfilled resins. This exacerbates the aforementioned problems associated with the high initial viscosities of filled compositions, resulting in increasingly less efficient, more costly additive fabrication processes over time.

Additionally, highly filled compositions are usually not as thermal- or photo-stable as non-filled liquid radiation curable resins for additive fabrication. Photo stability is the ability of a liquid radiation curable resin to maintain its viscosity after exposure to ambient light and undesirable light scattering in additive fabrication machines. Thermal stability is the ability of a liquid radiation curable resin to maintain its viscosity after exposure to elevated temperatures, which are known to accelerate cationic polymerization. Because liquid radiation curable resins for additive fabrication include reactive species that are responsive to undesirable ambient light scattering that occurs as a result of contact with crystallized filled particles, partial uncontrolled polymerization occurs in the liquid radiation curable resin after it is exposed to light. This small amount of uncontrolled polymerization, over time, is accelerated if the resin is stored at elevated temperatures. These factors cause the viscosity of the liquid radiation curable resin to increase gradually—but significantly—over time. Thus achieving sufficient viscosity stability is particularly challenging in highly filled liquid radiation curable resins because of additional light scattering effects caused by the filler.

A third problem traditionally associated with filled liquid radiation curable compositions for additive fabrication is their tendency to phase separate in storage or a vat over time. This phase separation, whereby the inorganic filler loses its state of homogeneous suspension in the surrounding liquid radiation curable resin, results in a vat made up of a bifurcated composition: (1) a low-viscosity, largely unfilled top portion, and (2) a supersaturated, high-viscosity bottom portion. The resin in the top portion of a vat is not able to produce cured parts possessing sufficient strength and stiffness (because of a lack of filled component present in the composition), while the bottom portion is devoid of any suitability for additive fabrication at all (due to an excess of filled particles). Despite the historical inclusion of inorganic particles designed for anti-sedimentation, existing filled liquid radiation curable compositions for additive fabrication invariably eventually settle, either into a "soft pack" or a "hard pack." In the more benign settling phenomenon, a soft pack, the settled filler forms a waxy portion at the bottom of a storage container or vat. The settled filler is frequently surrounded by partially polymerized resin, resulting in the wax-like consistency. Although re-assimilation into the liquid radiation curable resin as a whole is possible, it requires frequent and often vigorous recirculation. This is a time- and energy-consuming maintenance process, and still does not obviate a resin's eventual viscosity increase, due to the rampant partial polymerization.

Still other filled liquid radiation curable compositions for additive fabrication settle into an undesirable "hard pack." Hard pack occurs whereby the inorganic filler settles to the bottom of a storage container or vat, forming a concrete-like piece or pieces. These pieces must be broken up by a drill or similar apparatus, and are typically unable to be re-assimilated into the liquid radiation curable resin as a whole. This shortens the shelf-life of such resins, or results in changing and inconsistent properties in the cured parts made therefrom, due to the changing amounts of filler component which are not re-miscible into the solution. Thus, it is especially desirable to formulate a liquid radiation curable resin composition for additive fabrication which, in addition to the other required performance characteristics mentioned above, possesses superior anti-sedimentation capabilities.

Various other patents or patent publications also describe using inorganic filled compositions comprising, inter alia, silica microparticles and/or nanoparticles, among them:

U.S. Pat. No. 6,013,714 (Haruta et al.), assigned to DSM IP Assets, B.V., which describes additive fabrication processes that utilizes filled resins to performing a combination of steps, including (1) applying a thin layer of resin on a supporting stage; (2) selectively irradiating the thin layer of resin as to cure a selected part of said resin; (3) applying a further thin layer of resin; and repeating steps (2) and (3) as to obtain a three dimensional shape of a plurality of cured layers, optionally combined with either one of the steps of washing and post-curing the three dimensional shape, as to obtain the mold, wherein the resin composition is formulated from constituents comprises at least one photoreaction monomer at least one photoinitiator at least one filler.

U.S. Pat. Pub. No. 20050040562 (Steinmann et al.), assigned to 3D Systems, Inc., which describes a process for forming a three-dimensional article by stereolithography, said process comprising the steps: 1) coating a thin layer of a liquid radiation-curable composition onto a surface of said composition including at least one filler comprising silica-type nano-particles suspended in the radiation-curable composition: 2) exposing said thin layer imagewise to actinic radiation to form an imaged cross-section, wherein the radiation is of sufficient intensity to cause substantial curing of the thin layer in the exposed areas; 3) coating a thin layer of the composition onto the previously exposed imaged cross-section; 4) exposing said thin layer from step (3) imagewise to actinic radiation to form an additional imaged cross-section, wherein the radiation is of sufficient intensity to cause substantial curing of the thin layer in the exposed areas and to cause adhesion to the previously exposed imaged cross-section; 5) repeating steps (3) and (4) a sufficient number of times in order to build up the three-dimensional article.

U.S. Pat. Pub. No. 20120251841 (Southwell et al.), assigned to DSM IP Assets B.V., which describes liquid radiation curable resins for additive fabrication comprising an R-substituted aromatic thioether triaryl sulfonium tetrakis (pentafluorophenyl)borate cationic photoinitiator and silica nanoparticles. Also disclosed is a process for using the liquid radiation curable resins for additive fabrication and three-dimensional articles made from the liquid radiation curable resins for additive fabrication.

From the foregoing, it is evident that no filled liquid radiation curable compositions for additive fabrication exist that are suitable for producing cured components having adequate application-specific heat resistance and structural rigidity, while simultaneously overcoming the long-felt but unsolved industry needs of providing the requisite low initial viscosity, high viscosity stability, and high phase-separation resistance.

BRIEF SUMMARY

The first aspect of the claimed invention is a liquid radiation curable composition for additive fabrication comprising:
(a) a cationically polymerizable aliphatic epoxide;
(b) a multifunctional (meth)acrylate component;
(c) a cationic photoinitiator;
(d) a free-radical photoinitiator; and
(e) a filled matrix comprising
a nanoparticle constituent comprising a plurality of inorganic nanoparticles, and
a microparticle constituent comprising a plurality of inorganic microparticles; wherein the ratio by weight of the microparticle constituent to the nanoparticle constituent is from about 1:1 to about 12:1, more preferably from about 4:1 to about 8:1, and wherein the ratio of the average particle size of the inorganic microparticles in the microparticle constituent to the average particle size of the inorganic nanoparticles in the nanoparticle constituent is from about 2.41:1 to about 200:1, more preferably from about 6.46:1 to about 100:1.

The second aspect of the claimed invention is a process of forming a three-dimensional object comprising the steps of forming and selectively curing a layer of the liquid radiation curable resin composition according to the present invention as described herein with actinic radiation and repeating the steps of forming and selectively curing a layer of the liquid radiation curable resin composition for additive fabrication as described herein a plurality of times to obtain a three-dimensional object.

The third aspect of the claimed invention is the three-dimensional object formed from the liquid radiation curable resin of the first aspect of the present invention by the process of the second aspect of the claimed invention.

The fourth aspect of the claimed invention is a liquid radiation curable resin for additive fabrication comprising:
(a) a cationically polymerizable component;
(b) a (meth)acrylate component;
(c) a cationic photoinitiator;
(d) a free-radical photoinitiator; and
(e) a filled matrix, further comprising
a filled particle dispersion containing
a nanoparticle constituent made up of a plurality of silica nanoparticles having an average particle size of at least about 50 nanometers, and a solvent, and
a microparticle constituent made up of a plurality of inorganic microparticles; wherein the ratio by weight of the microparticle constituent to the nanoparticle constituent is from about 1:1 to about 12:1; and
wherein the filled particle dispersion has a particle dispersion pH of greater than about 5.5.

DETAILED DESCRIPTION

Figure 1:
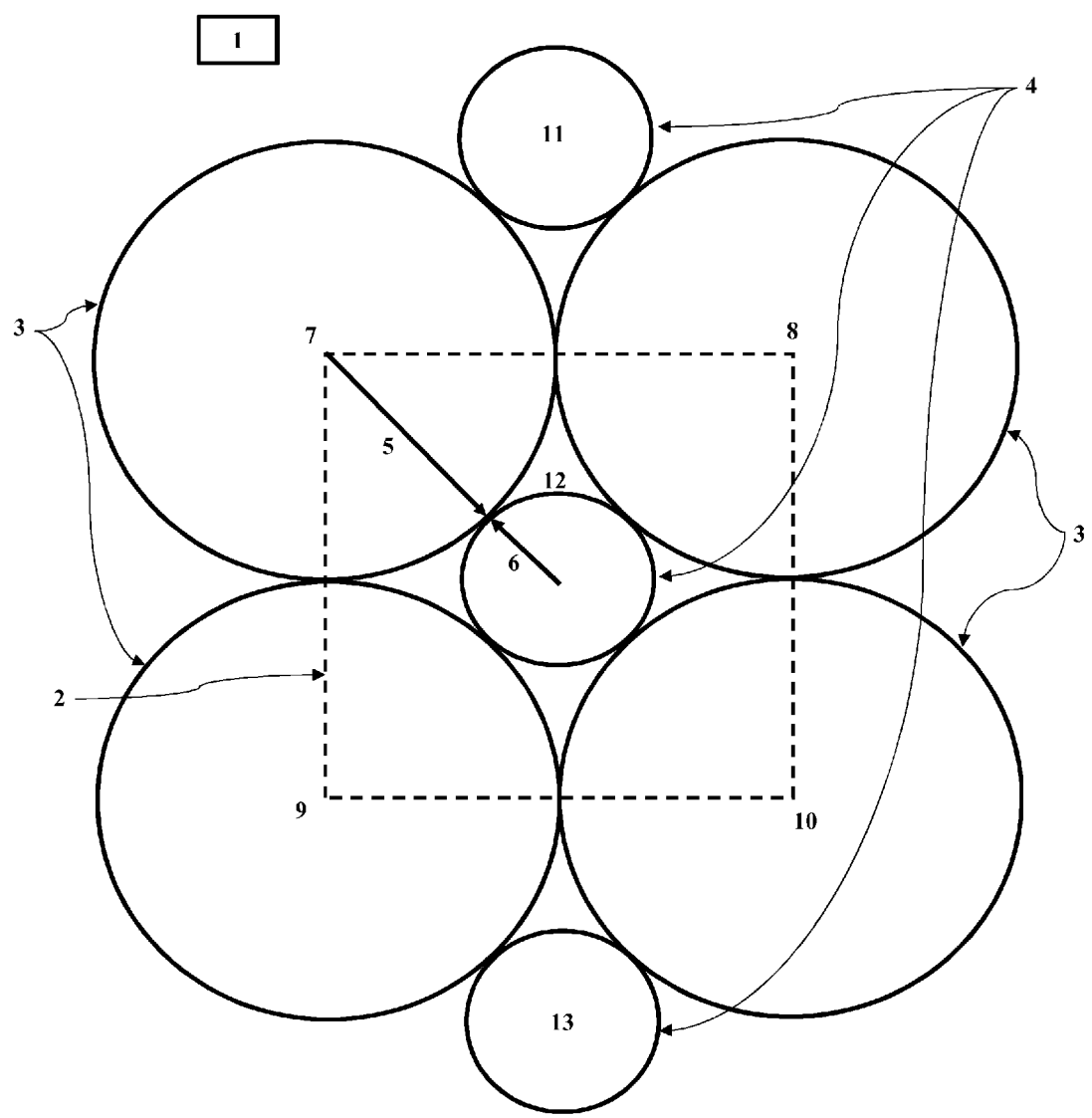
FIG. 1 depicts a two-dimensional cross-sectional view of an embodiment of a square configuration filled matrix of the present invention.

An embodiment of the claimed invention is a liquid radiation curable composition for additive fabrication, comprising:
(a) a cationically polymerizable aliphatic epoxide;
(b) a multifunctional (meth)acrylate component;
(c) a cationic photoinitiator;
(d) a free-radical photoinitiator; and
(e) a filled matrix comprising
a nanoparticle constituent comprising a plurality of inorganic nanoparticles, and
a microparticle constituent comprising a plurality of inorganic microparticles; wherein the ratio by weight of the microparticle constituent to the nanoparticle constituent is from about 1:1 to about 12:1, more preferably from about 4:1 to about 8:1, and wherein the ratio of the average particle size of the inorganic microparticles in the microparticle constituent to the average particle size of the inorganic nanoparticles in the nanoparticle constituent is from about 2.41:1 to about 200:1, more preferably from about 6.46:1 to about 100:1.

Cationically Polymerizable Component

In accordance with an embodiment, the liquid radiation curable resins for additive fabrication of the invention comprise at least one cationically polymerizable component; that is a component which undergoes polymerization initiated by cations or in the presence of acid generators. The cationically polymerizable components may be monomers, oligomers, and/or polymers, and may contain aliphatic, aromatic, cycloaliphatic, arylaliphatic, heterocyclic moiety(ies), and any combination thereof. Suitable cyclic ether compounds can comprise cyclic ether groups as side groups or groups that form part of an alicyclic or heterocyclic ring system.

The cationic polymerizable component is selected from the group consisting of cyclic ether compounds, cyclic acetal compounds, cyclic thioethers compounds, spiro-orthoester compounds, cyclic lactone compounds, and vinyl ether compounds, and any combination thereof.

Suitable cationically polymerizable components include cyclic ether compounds such as epoxy compounds and oxetanes, cyclic lactone compounds, cyclic acetal compounds, cyclic thioether compounds, spiro orthoester compounds, and vinylether compounds. Specific examples of cationically polymerizable components include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resins, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexanecarboxylate, 2-(3,4-epoxycyclohexyl-5,5-spiro-3,4-epoxy)-cyclohexane-1,4-dioxane, bis(3,4-epoxycyclohexylmethyl)adipate, vinylcyclohexene oxide, 4-vinylepoxycyclohexane, vinylcyclohexene dioxide, limonene oxide, limonene dioxide, bis(3,4-epoxy-6-methylcyclohexylmethyl)adipate, 3,4-epoxy-6-methylcyclohexyl-3',4'-epoxy-6'-methylcyclohexanecarboxylate, ε-caprolactone-modified 3,4-epoxycyclohexylmethyl-3',4'-epoxycyclohexane carboxylates, trimethylcaprolactone-modified 3,4-epoxycyclohexylmethyl-3',4'-epoxycyclohexane carboxylates, β-methyl-δ-valerolactone-modified 3,4-epoxycyclohexcylmethyl-3',4'-epoxycyclohexane carboxylates, methylenebis(3,4-epoxycyclohexane), bicyclohexyl-3,3'-epoxide, bis(3,4-epoxycyclohexyl) with a linkage of —O—, —S—, —SO—, —SO$_2$—, —C(CH$_3$)$_2$—, —CBr$_2$—, —C(CBr$_3$)$_2$—, —C(CF$_3$)$_2$—, —C(CCl$_3$)$_2$—, or —CH(C$_6$H$_5$)— dicyclopentadiene diepoxide, di(3,4-epoxycyclohexylmethyl) ether of ethylene glycol, ethylenebis(3,4-epoxycyclohexanecarboxylate), epoxyhexahydrooctylphthalate, epoxyhexahydro-di-2-ethylhexyl phthalate, 1,4-butanediol diglycidyl ether, 1,6-hexanediol diglycidyl ether, neopentylglycol diglycidyl ether, glycerol triglycidyl ether, trimethylolpropane triglycidyl ether, polyethylene glycol diglycidyl ether, polypropylene glycol diglycidyl ether, diglycidyl esters of aliphatic long-chain dibasic acids, monoglycidyl ethers of aliphatic higher alcohols, monoglycidyl ethers of phenol, cresol, butyl phenol, or polyether alcohols obtained by the addition of alkylene oxide to these compounds, glycidyl esters of higher fatty acids, epoxidated soybean oil, epoxybutylstearic acid, epoxyoctylstearic acid, epoxidated linseed oil, epoxidated polybutadiene, 1,4-bis[(3-ethyl-3-oxetanylmethoxy)methyl]benzene, 3-ethyl-3-hydroxymethyloxetane, 3-ethyl-3-(3-hydroxypropyl)oxymethyloxetane, 3-ethyl-3-(4-hydroxybutyl)oxymethyloxetane, 3-ethyl-3-(5-hydroxypentyl)oxymethyloxetane, 3-ethyl-3-phenoxymethyloxetane, bis((1-ethyl(3-oxetanyl))methyl) ether, 3-ethyl-3-((2-ethylhexyloxy)methyl)oxetane, 3-ethyl-((triethoxysilylpropoxymethyl)oxetane, 3-(meth)-allyloxymethyl-3-ethyloxetane, 3-hydroxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]-benzene, [1-(3-ethyl-3-oxetanylmethoxy)ethyl]phenyl ether, isobutoxymethyl(3-ethyl-3-oxetanylmethyl)ether, 2-ethylhexyl(3-ethyl-3-oxetanylmethyl)ether, ethyldiethylene glycol(3-ethyl-3-oxetanylmethyl)ether, dicyclopentadiene (3-ethyl-3-oxetanylmethyl)ether, dicyclopentenyloxyethyl (3-ethyl-3-oxetanylmethyl)ether, dicyclopentenyl(3-ethyl-3-oxetanylmethyl)ether, tetrahydrofurfuyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, and any combination thereof.

The cationically polymerizable component may optionally also contain polyfunctional materials including dendritic polymers such as dendrimers, linear dendritic polymers, dendrigraft polymers, hyperbranched polymers, star branched polymers, and hypergraft polymers with epoxy or oxetane functional groups. The dendritic polymers may contain one type of polymerizable functional group or different types of polymerizable functional groups, for example, epoxy and oxetane functions.

In an embodiment, the composition of the present invention also comprises one or more mono or poly glycidylethers of aliphatic alcohols, aliphatic polyols, polyesterpolyols or polyetherpolyols. Examples of preferred components include 1,4-butanedioldiglycidylether, glycidylethers of polyoxyethylene and polyoxypropylene glycols and triols of molecular weights from about 200 to about 10,000; glycidylethers of polytetramethylene glycol or poly(oxyethylene-oxybutylene) random or block copolymers. In a specific embodiment, the cationically polymerizable component comprises a polyfunctional glycidylether that lacks a cyclohexane ring in the molecule. In another specific embodiment, the cationically polymerizable component includes a neopentyl glycol diglycidyl ether. In another specific embodiment, the cationically polymerizable component includes a 1,4 cyclohexanedimethanol diglycidyl ether.

Examples of commercially available preferred polyfunctional glycidylethers are Erisys™ GE 22 (Erisys™ products are available from Emerald Performance Materials™), Heloxy™ 48, Heloxy™ 67, Heloxy™ 68, Heloxy™ 107 (Heloxy™ modifiers are available from Momentive Specialty Chemicals), and Grilonit® F713. Examples of commercially available preferred monofunctional glycidylethers are Heloxy™ 71, Heloxy™ 505, Heloxy™ 7, Heloxy™ 8, and Heloxy™ 61.

In an embodiment, the epoxide is 3,4-epoxycyclohexylmethyl-3',4-epoxycyclohexanecarboxylate (available as CELLOXIDE™ 2021P from Daicel Chemical, or as CYRACURE™ UVR-6105 from Dow Chemical), hydrogenated bisphenol A-epichlorohydrin based epoxy resin (available as EPON™ 1510 from Momentive), 1,4-cyclohexanedimethanol diglycidyl ether (available as HELOXY™ 107 from Momentive), a hydrogenated bisphenol A diglycidyl ether (available as EPON™ 825 from Momentive) a mixture of dicyclohexyl diepoxide and nanosilica (available as NANOPDX™), and any combination thereof.

The above-mentioned cationically polymerizable compounds can be used singly or in combination of two or more thereof. In embodiments of the invention, the cationic polymerizable component further comprises at least two different epoxy components. In a specific embodiment, the cationic polymerizable component includes a cycloaliphatic epoxy, for example, a cycloaliphatic epoxy with 2 or more than 2 epoxy groups. In another specific embodiment, the cationic polymerizable component includes an epoxy having an aromatic or aliphatic glycidyl ether group with 2 (difunctional) or more than 2 (polyfunctional) epoxy groups.

The liquid radiation curable resin for additive fabrication can therefore include suitable amounts of the cationic polymerizable component, for example, in certain embodiments, in an amount from about 10 to about 80% by weight of the resin composition, in further embodiments from about 20 to about 70 wt % of the resin composition, and in further embodiments from about 25 to about 65 wt % of the resin composition.

In other embodiments of the invention, the cationic polymerizable component also optionally comprises an oxetane component. In a specific embodiment, the cationic polymerizable component includes an oxetane, for example, an oxetane containing 1, 2 or more than 2 oxetane groups. If utilized in the composition, the oxetane component is present in a suitable amount from about 5 to about 30 wt % of the resin composition. In another embodiment, the oxetane component is present in an amount from about 10 to about 25 wt % of the resin composition, and in yet another embodiment, the oxetane component is present in an amount from 20 to about 30 wt % of the resin composition.

In accordance with an embodiment, the liquid radiation curable resin composition for additive fabrication contains a component that is polymerizable by both free-radical polymerization and cationic polymerization. An example of such a polymerizable component is a vinyloxy compound, for example, one selected from the group consisting of bis(4-vinyloxybutyl)isophthalate, tris(4-vinyloxybutyl) trimellitate, and combinations thereof. Other examples of such a polymerizable component include those containing an acrylate and an epoxy group, or an acrylate and an oxetane group, on a same molecule.

Radically Polymerizable Component

In accordance with an embodiment of the invention, the liquid radiation curable resin for additive fabrication of the invention comprises at least one free-radical polymerizable component, that is, a component which undergoes polymerization initiated by free radicals. The free-radical polymerizable components are monomers, oligomers, and/or polymers; they are monofunctional or polyfunctional materials, i.e., have 1, 2, 3, 4, 5, 6, 7, 8, 9, 10 . . . 20 . . . 30 . . . 40 . . . 50 . . . 100, or more functional groups that can polymerize by free radical initiation, may contain aliphatic, aromatic, cycloaliphatic, arylaliphatic, heterocyclic moiety(ies), or any combination thereof. Examples of polyfunctional materials include dendritic polymers such as dendrimers, linear dendritic polymers, dendrigraft polymers, hyperbranched polymers, star branched polymers, and hypergraft polymers; see, e.g., US 2009/0093564 A1. The dendritic polymers may contain one type of polymerizable functional group or different types of polymerizable functional groups, for example, acrylates and methacrylate functions.

Examples of free-radical polymerizable components include acrylates and methacrylates such as isobornyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, benzyl (meth)acrylate, 4-butylcyclohexyl (meth)acrylate, acryloyl morpholine, (meth)acrylic acid, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, caprolactone acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, tridecyl (meth)acrylate, undecyl (meth)acrylate, lauryl (meth)acrylate, stearyl (meth)acrylate, isostearyl (meth)acrylate, tetrahydrofurfuryl (meth)acrylate, butoxyethyl (meth)acrylate, ethoxydiethylene glycol (meth)acrylate, benzyl (meth)acrylate, phenoxyethyl (meth)acrylate, polyethylene glycol mono(meth)acrylate, polypropylene glycol mono(meth)acrylate, methoxyethylene glycol (meth)acrylate, ethoxyethyl (meth)acrylate, methoxypolyethylene glycol (meth)acrylate, methoxypolypropylene glycol (meth)acrylate, diacetone (meth)acrylamide, beta-carboxyethyl (meth)acrylate, phthalic acid (meth)acrylate, dimethylaminoethyl (meth)acrylate, diethylaminoethyl (meth)acrylate, butylcarbamylethyl (meth)acrylate, n-isopropyl (meth)acrylamide fluorinated (meth)acrylate, 7-amino-3,7-dimethyloctyl (meth)acrylate.

Examples of polyfunctional free-radical polymerizable components include those with (meth)acryloyl groups such as trimethylolpropane tri(meth)acrylate, pentaerythritol (meth)acrylate, ethylene glycol di(meth)acrylate, bisphenol A diglycidyl ether di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate; 3,9-bis(1,1-dimethyl-2-hydroxyethyl)-2,4,8,10-tetraoxaspiro[5.5]undecane di(meth)acrylate; dipentaerythritol monohydroxypenta(meth)acrylate, propoxylated trimethylolpropane tri(meth)acrylate, propoxylated neopentyl glycol di(meth)acrylate, tetraethylene glycol di(meth)acrylate, polyethylene glycol di(meth)acrylate, 1,4-butanediol di(meth)acrylate, 1,6-hexanediol di(meth)acrylate, neopentyl glycol di(meth)acrylate, polybutanediol di(meth)acrylate, tripropyleneglycol di(meth)acrylate, glycerol tri(meth)acrylate, phosphoric acid mono- and di(meth)acrylates, $C_7$-$C_{20}$ alkyl di(meth)acrylates, tris(2-hydroxyethyl)isocyanurate tri(meth)acrylate, tris(2-hydroxyethyl)isocyanurate di(meth)acrylate, pentaerythritol tri(meth)acrylate, pentaerythritol tetra(meth)acrylate, dipentaerythritol hexa(meth)crylate, tricyclodecane diyl dimethyl di(meth)acrylate and alkoxylated versions (e.g., ethoxylated and/or propoxylated) of any of the preceding monomers, and also di(meth)acrylate of a diol which is an ethylene oxide or propylene oxide adduct to bisphenol A, di(meth)acrylate of a diol which is an ethylene oxide or propylene oxide adduct to hydrogenated bisphenol A, epoxy (meth)acrylate which is a (meth)acrylate adduct to bisphenol A of diglycidyl ether, diacrylate of polyoxyalkylated bisphenol A, and triethylene glycol divinyl ether, and adducts of hydroxyethyl acrylate.

In accordance with an embodiment, the radically polymerizable component is a polyfunctional (meth)acrylate. The polyfunctional (meth)acrylates may include all methacryloyl groups, all acryloyl groups, or any combination of methacryloyl and acryloyl groups. In an embodiment, the free-radical polymerizable component is selected from the group consisting of bisphenol A diglycidyl ether di(meth)acrylate, ethoxylated or propoxylated bisphenol A or bisphenol F di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate, dipentaerythritol monohydroxypenta(meth)acrylate, dipentaerythritol penta (meth)acrylate, dipentaerythritol hexa(meth)crylate, propoxylated trimethylolpropane tri(meth)acrylate, and propoxylated neopentyl glycol di(meth)acrylate, and any combination thereof.

In a preferred embodiment, the polyfunctional (meth)acrylate has more than 2, more preferably more than 3, and more preferably greater than 4 functional groups.

In another preferred embodiment, the radically polymerizable component consists exclusively of a single polyfunctional (meth)acrylate component. In further embodiments, the exclusive radically polymerizable component is tetrafunctional, in further embodiments, the exclusive radically polymerizable component is penta-functional, and in further embodiments, the exclusive radically polymerizable component is hexa-functional.

In another embodiment, the free-radical polymerizable component is selected from the group consisting of bisphenol A diglycidyl ether diacrylate, dicyclopentadiene dimethanol diacrylate, [2-[1,1-dimethyl-2-[(1-oxoallyl)oxy]ethyl]-5-ethyl-1,3-dioxan-5-yl]methyl acrylate, dipentaerythritol monohydroxypentaacrylate, propoxylated trimethylolpropane triacrylate, and propoxylated neopentyl glycol diacrylate, and any combination thereof.

In specific embodiments, the liquid radiation curable resins for additive fabrication of the invention include one or more of bisphenol A diglycidyl ether di(meth)acrylate, dicyclopentadiene dimethanol di(meth)acrylate, dipentaerythritol monohydroxypenta(meth)acrylate, propoxylated trimethylolpropane tri(meth)acrylate, and/or propoxylated neopentyl glycol di(meth)acrylate, and more specifically one or more of bisphenol A diglycidyl ether diacrylate, dicyclopentadiene dimethanol diacrylate, dipentaerythritol pentaacrylate, propoxylated trimethylolpropane triacrylate, and/or propoxylated neopentyl glycol diacrylate.

The above-mentioned radically polymerizable compounds can be used singly or in combination of two or more thereof. The liquid radiation curable resin for additive fabrication can include any suitable amount of the free-radical polymerizable components, for example, in certain embodiments, in an amount up to about 40 wt % of the resin composition, in certain embodiments, from about 2 to about 40 wt % of the resin composition, in other embodiments from about 5 to about 30 wt %, and in further embodiments from about 10 to about 20 wt % of the resin composition.

Hydroxy Functional Components

Many of the known liquid radiation curable resin compositions for additive fabrication use hydroxy-functional compounds to enhance the properties of the parts made from the resin compositions.

In certain embodiments of the invention, the resin composition may optionally contain a hydroxy-functional component. The hydroxyl-containing material which can be used in the present invention may be any suitable organic material having a hydroxyl functionality of at least 1. If present, the material is preferably substantially free of any groups which interfere with the curing reactions or which are thermally or photolytically unstable.

If present, any hydroxy group may be employed for the particular purpose. If present, the hydroxyl-containing material preferably contains one or more primary or secondary aliphatic hydroxyl. The hydroxyl group may be internal in the molecule or terminal. Monomers, oligomers or polymers can be used. The hydroxyl equivalent weight, i.e., the number average molecular weight divided by the number of hydroxyl groups, is preferably in the range of 31 to 5000.

Representative examples of hydroxyl-containing materials having a hydroxyl functionality of 1 include alkanols, monoalkyl ethers of polyoxyalkyleneglycols, mohoalkyl ethers of alkyleneglycols, and others, and combinations thereof.

Representative examples of monomeric polyhydroxy organic materials include alkylene and arylalkylene glycols and polyols, such as 1,2,4-butanetriol, 1,2,6-hexanetriol, 1,2,3-heptanetriol, 2,6-dimethyl-1,2,6-hexanetriol, (2R,3R)-(–)-2-benzyloxy-1,3,4-butanetriol, 1,2,3-hexanetriol, 1,2,3-butanetriol, 3-methyl-1,3,5-pentanetriol, 1,2,3-cyclohexanetriol, 1,3,5-cyclohexanetriol, 3,7,11,15-tetramethyl-1,2,3-hexadecanetriol, 2-hydroxymethyltetrahydropyran-3,4,5-triol, 2,2,4,4-tetramethyl-1,3-cyclobutanediol, 1,3-cyclopentanediol, trans-1,2-cyclooctanediol, 1,16-hexadecanediol, 3,6-dithia-1,8-octanediol, 2-butyne-1,4-diol, 1,3-propanediol, 1,4-butanediol, 1,5-pentanediol, 1,6-hexanediol, 1,7-heptanediol, 1,8-octanediol, 1,9-nonanediol, 1-phenyl-1,2-ethanediol, 1,2-cyclohexanediol, 1,5-decalindiol, 2,5-dimethyl-3-hexyne-2,5-diol, 2,7-dimethyl-3,5-octadiyne-2-7-diol, 2,3-butanediol, 1,4-cyclohexanedimethanol, and combinations thereof.

Representative examples of oligomeric and polymeric hydroxyl-containing materials include polyoxyethylene and polyoxypropylene glycols and triols of molecular weights from about 200 to about 10,000; polytetramethylene glycols of varying molecular weight; poly(oxyethylene-oxybutylene) random or block copolymers; copolymers containing pendant hydroxy groups formed by hydrolysis or partial hydrolysis of vinyl acetate copolymers, polyvinylacetal resins containing pendant hydroxyl groups; hydroxy-terminated polyesters and hydroxy-terminated polylactones; hydroxy-functionalized polyalkadienes, such as polybutadiene; aliphatic polycarbonate polyols, such as an aliphatic polycarbonate diol; and hydroxy-terminated polyethers, and combinations thereof.

If present, preferred hydroxyl-containing monomers include 1,4-cyclohexanedimethanol and aliphatic and cycloaliphatic monohydroxy alkanols. Such preferred hydroxyl-containing oligomers and polymers include hydroxyl and hydroxyl/epoxy functionalized polybutadiene, polycaprolactone diols and triols, ethylene/butylene polyols, and monohydroxyl functional monomers. Preferred examples of polyether polyols are polypropylene glycols of various molecular weights and glycerol propoxylate-B-ethoxylate triol. If present, especially preferred are linear and branched polytetrahydrofuran polyether polyols available in various molecular weights, such as in the range of 150-4000 g/mol, preferably in the range of 150-1500 g/mol, more preferably in the range of 150-750 g/mol.

If present, the resin composition preferably comprises, relative to the total weight of the resin composition, at most 10 wt % of one or more non-free radical polymerizable hydroxy-functional compounds, more preferably at most 5 wt %, and most preferably at most 2 wt %.

In embodiments, the liquid radiation curable resin for additive fabrication of the present invention includes a photoinitiating system. The photoinitiating system can include a free-radical photoinitiator and/or a cationic photoinitiator. In accordance with an embodiment, the liquid radiation curable resin composition includes a photoinitiating system contains at least one photoinitiator having a cationic initiating function, and at least one photoinitiator having a free radical initiating function. Additionally, the photoinitiating system can include a photoinitiator that contains both free-radical initiating function and cationic initiating function on the same molecule. The photoinitiator is a compound that chemically changes due to the action of light or the synergy between the action of light and the electronic excitation of a sensitizing dye to produce at least one of a radical, an acid, and a base.

Cationic Photoinitiator

In accordance with an embodiment, the liquid radiation curable resin composition includes a cationic photoinitiator. The cationic photoinitiator initiates cationic ring-opening polymerization upon irradiation of light.

In an embodiment, any suitable cationic photoinitiator can be used, for example, those with cations selected from the group consisting of onium salts, halonium salts, iodosyl salts, selenium salts, sulfonium salts, sulfoxonium salts, diazonium salts, metallocene salts, isoquinolinium salts, phosphonium salts, arsonium salts, tropylium salts, dialkylphenacylsulfonium salts, thiopyrilium salts, diaryl iodonium salts, triaryl sulfonium salts, ferrocenes, di(cyclopentadienyliron)arene salt compounds, and pyridinium salts, and any combination thereof.

In another embodiment, the cation of the cationic photoinitiator is selected from the group consisting of aromatic diazonium salts, aromatic sulfonium salts, aromatic iodonium salts, metallocene based compounds, aromatic phosphonium salts, and any combination thereof. In another embodiment, the cation is a polymeric sulfonium salt, such as in U.S. Pat. No. 5,380,923 or U.S. Pat. No. 5,047,568, or other aromatic heteroatom-containing cations and naphthyl-sulfonium salts such as in U.S. Pat. No. 7,611,817, U.S. Pat. No. 7,230,122, US2011/0039205, US2009/0182172, U.S. Pat. No. 7,678,528, EP2308865, WO2010046240, or EP2218715. In another embodiment, the cationic photoinitiator is selected from the group consisting of triarylsulfonium salts, diaryliodonium salts, and metallocene based compounds, and any combination thereof. Onium salts, e.g., iodonium salts and sulfonium salts, and ferrocenium salts, have the advantage that they are generally more thermally stable.

In a particular embodiment, the cationic photoinitiator has an anion selected from the group consisting of $BF_4^-$, $AsF_6^-$, $SbF_6^-$, $PF_6^-$. $[B(CF_3)_4]^-$, $B(C_6F_5)_4^-$, $B[C_6H_3\text{-}3,5(CF_3)_2]_4^-$, $B(C_6H_4CF_3)_4^-$, $B(C_6H_3F_2)_4^-$, $B[C_6F_4\text{-}4(CF_3)]_4^-$, $Ga(C_6F_5)_4^-$, $[(C_6F_5)_3B\text{—}C_3H_3N_2\text{—}B(C_6F_5)_3]^-$, $[(C_6F_5)_3B\text{—}NH_2\text{—}B(C_6F_5)_3]^-$, tetrakis(3,5-difluoro-4-alkyloxyphenyl)borate, tetrakis(2,3,5,6-tetrafluoro-4-alkyloxyphenyl)borate, perfluoroalkylsulfonates, tris[(perfluoroalkyl)sulfonyl]methides, bis[(perfluoroalkyl)sulfonyl]imides, perfluoroalkylphosphates, tris(perfluoroalkyl)trifluorophosphates, bis(perfluoroalkyl)tetrafluorophosphates, tris(pentafluoroethyl)trifluorophosphates, and $(CH_6B_{11}Br_6)^-$, $(CH_6B_{11}Cl_6)^-$ and other halogenated carborane anions.

A survey of other onium salt initiators and/or metallocene salts can be found in "UV Curing, Science and Technology", (Editor S. P. Pappas, Technology Marketing Corp., 642 Westover Road, Stamford, Conn., U.S.A.) or "Chemistry & Technology of UV & EB Formulation for Coatings, Inks & Paints", Vol. 3 (edited by P. K. T. Oldring).

In an embodiment, the cationic photoinitiator has a cation selected from the group consisting of aromatic sulfonium salts, aromatic iodonium salts, and metallocene based compounds with at least an anion selected from the group consisting of $SbF_6^-$, $PF_6^-$, $B(C_6F_5)_4^-$, $[B(CF_3)_4]^-$, tetrakis(3,5-difluoro-4-methoxyphenyl)borate, perfluoroalkylsulfonates, perfluoroalkylphosphates, tris[(perfluoroalkyl)sulfonyl]methides, and $[(C_2F_5)_3PF_3]^-$.

Examples of cationic photoinitiators useful for curing at 300-475 nm, particularly at 365 nm UV light, without a sensitizer include 4-[4-(3-chlorobenzoyl)phenylthio]phenylbis(4-fluorophenyl)sulfonium hexafluoroantimonate, 4-[4-(3-chlorobenzoyl)phenylthio]phenylbis(4-fluorophenyl)sulfonium tetrakis(pentafluorophenyl)borate, 4-[4-(3-chlorobenzoyl)phenylthio]phenylbis(4-fluorophenyl)sulfonium tetrakis(3,5-difluoro-4-methyloxyphenyl)borate, 4-[4-(3-chlorobenzoyl)phenylthio]phenylbis(4-fluorophenyl)sulfonium tetrakis(2,3,5,6-tetrafluoro-4-methyloxyphenyl)borate, tris(4-(4-acetylphenyl)thiophenyl)sulfonium tetrakis(pentafluorophenyl)borate (Irgacure® PAG 290 from BASF), tris(4-(4-acetylphenyl)thiophenyl)sulfonium tris[(trifluoromethyl)sulfonyl]methide (Irgacure® GSID 26-1 from BASF), tris(4-(4-acetylphenyl)thiophenyl)sulfonium hexafluorophosphate (Irgacure® 270 from BASF), and HS-1 available from San-Apro Ltd.

Preferred cationic photoinitiators include, either alone or in a mixture: bis[4-diphenylsulfoniumphenyl]sulfide bishexafluoroantimonate; thiophenoxyphenylsulfonium hexafluoroantimonate (available as Chivacure 1176 from Chitec), tris(4-(4-acetylphenyl)thiophenyl)sulfonium tetrakis(pentafluorophenyl)borate (Irgacure® PAG 290 from BASF), tris(4-(4-acetylphenyl)thiophenyl)sulfonium tris[(trifluoromethyl)sulfonyl]methide (Irgacure® GSID 26-1 from BASF), and tris(4-(4-acetylphenyl)thiophenyl)sulfonium hexafluorophosphate (Irgacure® 270 from BASF), [4-(1-methylethyl)phenyl](4-methylphenyl) iodonium tetrakis (pentafluorophenyl)borate (available as Rhodorsil 2074 from Rhodia), 4-[4-(2-chlorobenzoyl)phenylthio]phenylbis(4-fluorophenyl)sulfonium hexafluoroantimonate (as SP-172 from Adeka), SP-300 from Adeka, and aromatic sulfonium salts with anions of $(PF_{6-m}(C_nF_{2n+1})_m)^-$ where m is an integer from 1 to 5, and n is an integer from 1 to 4 (available as CPI-200K or CPI-200S, which are monovalent sulfonium salts from San-Apro Ltd., TK-1 available from San-Apro Ltd., or HS-1 available from San-Apro Ltd.).

In various embodiments, the liquid radiation curable resin composition for additive fabrication may be irradiated by laser or LED light operating at any wavelength in either the UV or visible light spectrum. In particular embodiments, the irradiation is from a laser or LED emitting a wavelength of from 340 nm to 415 nm. In particular embodiments, the laser or LED source emits a peak wavelength of about 340 nm, 355 nm, 365 nm, 375 nm, 385 nm, 395 nm, 405 nm, or 415 nm.

In an embodiment of the invention, the liquid radiation curable resin for additive fabrication comprises an aromatic triaryl sulfonium salt cationic photoinitiator.

Use of aromatic triaryl sulfonium salts in additive fabrication applications is known. Please see US 20120251841 to DSM IP Assets, B.V. (which is hereby incorporated in its entirety), U.S. Pat. No. 6,368,769, to Asahi Denki Kogyo, which discusses aromatic triaryl sulfonium salts with tetraryl borate anions, including tetrakis(pentafluorophenyl)borate, and use of the compounds in stereolithography applications. Triarylsulfonium salts are disclosed in, for example, J Photopolymer Science & Tech (2000), 13(1), 117-118 and J Poly Science, Part A (2008), 46(11), 3820-29. Triarylsulfonium salts $Ar_3S^+Mxn^-$ with complex metal halide anions such as $BF_4^-$, $AsF_6^-$, $PF_6^-$, and $SbF_6^-$, are disclosed in J Polymr Sci, Part A (1996), 34(16), 3231-3253.

The use of aromatic triaryl sulfonium salts as the cationic photoinitiator in liquid radiation curable resins is desirable in additive fabrication processes because the resulting resin attains a fast photospeed, good thermal-stability, and good photo-stability.

In a preferred embodiment, the cationic photoinitiator is an aromatic triaryl sulfonium salt that is more specifically an R-substituted aromatic thioether triaryl sulfonium tetrakis (pentafluorophenyl)borate cationic photoinitiator, having a tetrakis(pentafluorophenyl)borate anion and a cation of the following formula (I):

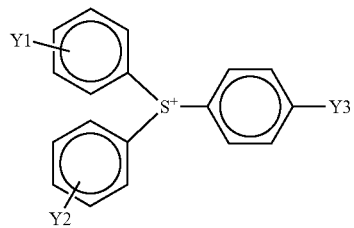

I wherein Y1, Y2, and Y3 are the same or different and wherein Y1, Y2, or Y3 are R-substituted aromatic thioether with R being an acetyl or halogen group.

In an embodiment, Y1, Y2, and Y3 are the same. In another embodiment, Y1 and Y2 are the same, but Y3 is different. In another embodiment, Y1, Y2, or Y3 are an R-substituted aromatic thioether with R being an acetyl or halogen group. Preferably Y1, Y2, or Y3 are a para-R-substituted aromatic thioether with R being an acetyl or halogen group.

A particularly preferred R-substituted aromatic thioether triaryl sulfonium tetrakis(pentafluorophenyl)borate cationic photoinitiator is tris(4-(4-acetylphenyl)thiophenyl)sulfonium tetrakis(pentafluorophenyl)borate. Tris(4-(4-acetylphenyl)thiophenyl)sulfonium tetrakis(pentafluorophenyl)borate is known commercially as IRGACURE® PAG-290 (formerly known by the development code GSID4480-1) and is available from Ciba/BASF.

An R-substituted aromatic thioether triaryl sulfonium tetrakis(pentafluorophenyl)borate cationic photoinitiator, for instance, tris(4-(4-acetylphenyl)thiophenyl)sulfonium tetrakis(pentafluorophenyl)borate, is also more thermally-stable than some other cationic photoinitiators. The improved thermal-stability allows liquid radiation curable resins for additive fabrication incorporating a triaryl sulfonium tetrakis (pentafluorophenyl)borate cationic photoinitiator instead of other conventional cationic photoinitiators to retain their viscosity at elevated temperatures for long periods of time.

In another embodiment, the cationic photoinitiator is an aromatic triaryl sulfonium salt that possesses an anion represented by $SbF_6^-$, $PF_6^-$, $BF_4^-$, $(CF_3CF_2)_3PF_3^-$ $(C_6F_5)_4B^-$, $((CF_3)_2C_6H_3)_4B^-$, $(C_6F_5)_4Ga^-$, $((CF_3)_2C_6H_3)_4Ga^-$, trifluoromethanesulfonate, nonafluorobutanesulfonate, methanesulfonate, butanesulfonate, benzenesulfonate, or p-toluenesulfonate, and a cation of the following formula (II):

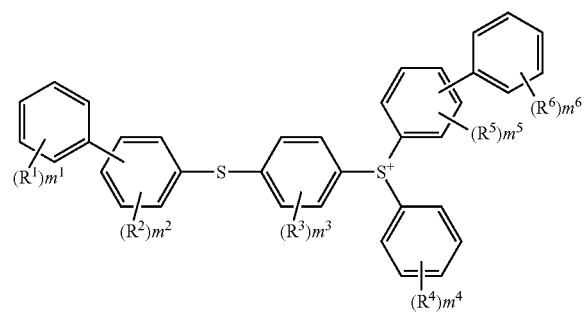

II wherein in formula (II), $R^1$, $R^2$, $R^3$, $R^5$ and $R^6$ each independently represent an alkyl group, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group, or a halogen atom, $R^4$ represents an alkyl group, a hydroxy group, an alkoxy group, an alkylcarbonyl group, an alkoxycarbonyl group, an acyloxy group, an alkylthio group, a heterocyclic hydrocarbon group, an alkylsulfinyl group, an alkylsulfonyl group, a hydroxy(poly)alkyleneoxy group, an optionally substituted amino group, a cyano group, a nitro group, or a halogen atom, $m^1$ to $m^6$ each represent the number of occurrences of each of $R^1$ to $R^6$, $m^1$, $m^4$, and $m^6$ each represent an integer of 0 to 5, $m^2$, $m^3$, and $m^5$ each represent an integer of 0 to 4. Such photoinitiators are described in, for example, U.S. Pat. No. 8,617,787.

A particularly preferred aromatic triaryl sulfonium cationic photoinitiator has an anion that is a fluoroalkyl-substituted fluorophosphate. Commercial examples of an aromatic triaryl sulfonium cationic photoinitiator having a fluoroalkyl-substituted fluorophosphate anion is the CPI-200 series (for example CPI-200K® or CPI-2105®) or 300 series, available from San-Apro Limited.

In accordance with embodiments of the invention, the liquid radiation curable resin for additive fabrication includes a cationic polymerizable component in addition to an R-substituted aromatic thioether triaryl sulfonium tetrakis(pentafluorophenyl)borate or fluoroalkyl-substituted fluorophosphate cationic photoinitiator. In other embodiments, the liquid radiation curable resins for additive fabrication include cationic polymerizable components, free-radical photoinitiators, and free-radical polymerizable components. In some embodiments, the liquid radiation curable resins for additive fabrication include an R-substituted aromatic thioether triaryl sulfonium tetrakis(pentafluorophenyl)borate cationic photoinitiator and additional cationic photoinitiators and/or photosensitizers, along with a cationic polymerizable component and, optionally, free-radical polymerizable components and free-radical photoinitiators.

The liquid radiation curable resin composition can include any suitable amount of the cationic photoinitiator, for example, in certain embodiments, in an amount up to about 15% by weight of the resin composition, in certain embodiments, up to about 5% by weight of the resin composition, and in further embodiments from about 2% to about 10% by weight of the resin composition, and in other embodiments, from about 0.1% to about 5% by weight of the resin composition. In a further embodiment, the amount of cationic photoinitiator is from about 0.2 wt % to about 4 wt % of the total resin composition, and in other embodiments from about 0.5 wt % to about 3 wt %.

In some embodiments, depending on the wavelength of light used for curing the liquid radiation curable resin, it is desirable for the liquid radiation curable resin composition to include a photosensitizer. The term "photosensitizer" is used to refer to any substance that either increases the rate of photoinitiated polymerization or shifts the wavelength at which polymerization occurs; see textbook by G. Odian, Principles of Polymerization, 3$^{rd}$ Ed., 1991, page 222. A variety of compounds can be used as photosensitizers, including heterocyclic and fused-ring aromatic hydrocarbons, organic dyes, and aromatic ketones. Examples of photosensitizers include those selected from the group consisting of methanones, xanthenones, pyrenemethanols, anthracenes, pyrene, perylene, quinones, xanthones, thioxanthones, benzoyl esters, benzophenones, and any combination thereof. Particular examples of photosensitizers include those selected from the group consisting of [4-[(4-methylphenyl)thio]phenyl]phenyl-methanone, isopropyl-9H-thioxanthen-9-one, 1-pyrenemethanol, 9-(hydroxymethyl)anthracene, 9,10-diethoxyanthracene, 9,10-dimethoxyanthracene, 9,10-dipropoxyanthracene, 9,10-dibutyloxyanthracene, 9-anthracenemethanol acetate, 2-ethyl-9,10-dimethoxyanthracene, 2-methyl-9,10-dimethoxyanthracene, 2-t-butyl-9,10-dimethoxyanthracene, 2-ethyl-9,10-diethoxyanthracene and 2-methyl-9,10-diethoxyanthracene, anthracene, anthraquinones, 2-methylanthraquinone, 2-ethylanthraquinone, 2-tertbutylanthraquinone, 1-chloroanthraquinone, 2-amylanthraquinone, thioxanthones and xanthones, isopropyl thioxanthone, 2-chlorothioxanthone, 2,4-diethylthioxanthone, 1-chloro-4-propoxythioxanthone, methyl benzoyl formate (Darocur MBF from BASF), methyl-2-benzoyl benzoate (Chivacure OMB from Chitec), 4-benzoyl-4'-methyl diphenyl sulphide (Chivacure BMS from Chitec), 4,4'-bis(diethylamino) benzophenone (Chivacure EMK from Chitec), and any combination thereof.

The novel mixtures may also contain various photoinitiators of different sensitivity to radiation of emission lines with different wavelengths to obtain a better utilization of a UV light source. The use of known photoinitiators of different sensitivity to radiation of emission lines is well known in the art of additive fabrication, and may be selected in accordance with radiation sources of, for example, 351, nm 355 nm, 365 nm, 385 nm, and 405 nm. In this context it is advantageous for the various photoinitiators to be selected such, and employed in a concentration such, that equal optical absorption is produced with the emission lines used.

The liquid radiation curable resin composition for additive fabrication can include any suitable amount of the photosensitizer, for example, in certain embodiments, in an amount up to about 10% by weight of the resin composition, in certain embodiments, up to about 5% by weight of the resin composition, and in further embodiments from about 0.05% to about 2% by weight of the resin composition.

Other Cationic Photoinitiators and Photosensitizers

In accordance with an embodiment, the liquid radiation curable resin for additive fabrication includes a cationic photoinitiator in addition to, or in lieu of, an R-substituted aromatic thioether triaryl sulfonium tetrakis(pentafluorophenyl)borate cationic photoinitiator. Any suitable cationic photoinitiator can be used, for example, those selected from the group consisting of onium salts, halonium salts, iodosyl salts, selenium salts, sulfonium salts, sulfoxonium salts, diazonium salts, metallocene salts, isoquinolinium salts, phosphonium salts, arsonium salts, tropylium salts, dialkylphenacylsulfonium salts, thiopyrilium salts, diaryl iodonium salts, triaryl sulfonium salts, sulfonium antimonate salts, ferrocenes, di(cyclopentadienyliron)arene salt compounds, and pyridinium salts, and any combination thereof. Onium salts, e.g., iodonium salts, sulfonium salts and ferrocenes, have the advantage that they are thermally-stable.

Preferred mixtures of cationic photoinitiators include a mixture of: bis[4-diphenylsulfoniumphenyl]sulfide bishexafluoroantimonate; thiophenoxyphenylsulfonium hexafluoroantimonate (available as Chivacure 1176 from Chitec); tris(4-(4-acetylphenyl)thiophenyl)sulfonium tetrakis(pentafluorophenyl)borate (Irgacure PAG-290 or GSID4480-1 from Ciba/BASF), iodonium, [4-(1-methylethyl)phenyl](4-methylphenyl)-, tetrakis(pentafluorophenyl)borate (available as Rhodorsil 2074 from Rhodia), 4-[4-(2-chlorobenzoyl)phenylthio]phenylbis(4-fluorophenyl) sulfonium hexafluoroantimonate (as SP-172) and SP-300 (both available from Adeka).

Additionally, photosensitizers are useful in combination with photoinitiators in effecting cure with LED light sources emitting in the wavelength range of 300-475 nm. Examples of suitable photosensitizers include: anthraquinones, such as 2-methylanthraquinone, 2-ethylanthraquinone, 2-tertbutylanthraquinone, 1-chloroanthraquinone, and 2-amylanthraquinone, thioxanthones and xanthones, such as isopropyl thioxanthone, 2-chlorothioxanthone, 2,4-diethylthioxanthone, and 1-chloro-4-propoxythioxanthone, methyl benzoyl formate (Darocur MBF from Ciba), methyl-2-benzoyl benzoate (Chivacure OMB from Chitec), 4-benzoyl-4'-methyl diphenyl sulphide (Chivacure BMS from Chitec), 4,4'-bis (diethylamino) benzophenone (Chivacure EMK from Chitec).

In an embodiment, the photosensitizer is a fluorone, e.g., 5,7-diiodo-3-butoxy-6-fluorone, 5,7-diiodo-3-hydroxy-6-fluorone, 9-cyano-5,7-diiodo-3-hydroxy-6-fluorone, or a photosensitizer is

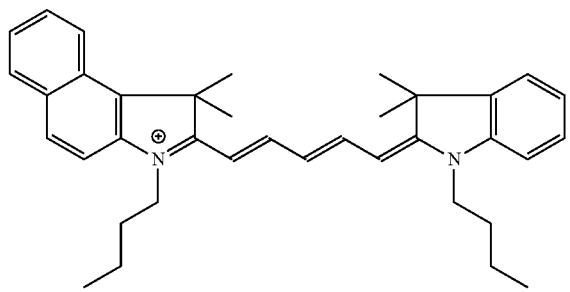

-continued

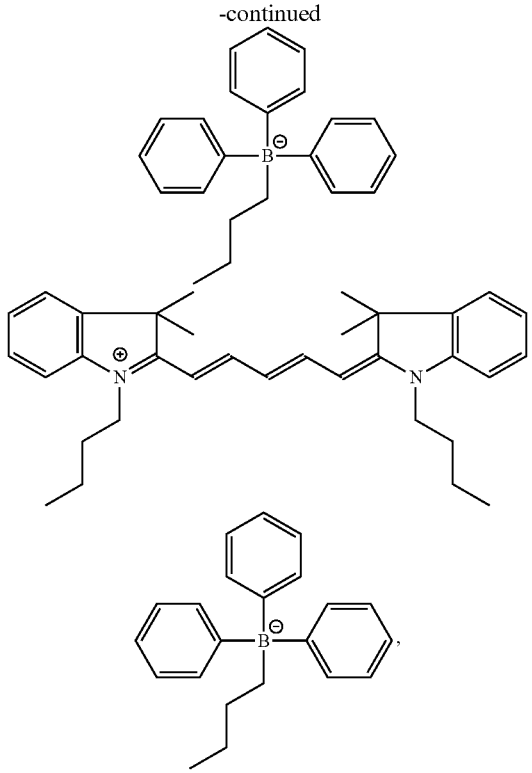

and any combination thereof.

The liquid radiation curable resin for additive fabrication can include any suitable amount of the photosensitizer, for example, in certain embodiments, in an amount up to about 10% by weight of the resin composition, in certain embodiments, up to about 5% by weight of the resin composition, and in further embodiments from about 0.05% to about 2% by weight of the resin composition.

When photosensitizers are employed, other photoinitiators absorbing at shorter wavelengths can be used. Examples of such photoinitiators include: benzophenones, such as benzophenone, 4-methyl benzophenone, 2,4,6-trimethyl benzophenone, and dimethoxybenzophenone, and 1-hydroxyphenyl ketones, such as 1-hydroxycyclohexyl phenyl ketone, phenyl (1-hydroxyisopropyl)ketone, 2-hydroxy-1-[4-(2-hydroxyethoxyl)phenyl]-2-methyl-1-propanone, and 4-isopropylphenyl(1-hydroxyisopropyl)ketone, benzil dimethyl ketal, and oligo-[2-hydroxy-2-methyl-1-[4-(1-methylvinyl)phenyl]propanone] (Esacure KIP 150 from Lamberti).

A photosensitizer or co-initiator may be used to improve the activity of the cationic photoinitiator. It is for either increasing the rate of photoinitiated polymerization or shifting the wavelength at which polymerization occurs. The sensitizer used in combination with the above-mentioned cationic photoinitiator is not particularly limited. A variety of compounds can be used as photosensitizers, including heterocyclic and fused-ring aromatic hydrocarbons, organic dyes, and aromatic ketones. Examples of sensitizers include compounds disclosed by J. V. Crivello in *Advances in Polymer Science,* 62, 1 (1984), and by J. V. Crivello & K. Dietliker, "Photoinitiators for Cationic Polymerization" in Chemistry & technology of UV & EB formulation for coatings, inks & paints. Volume III, Photoinitiators for free radical and cationic polymerization. by K. Dietliker; [Ed. by P. K. T. Oldring], SITA Technology Ltd, London, 1991. Specific examples include polyaromatic hydrocarbons and their derivatives such as anthracene, pyrene, perylene and their derivatives, thioxanthones, α-hydroxyalkylphenones, 4-benzoyl-4'-methyldiphenyl sulfide, acridine orange, and benzoflavin.

The liquid radiation curable resin for additive fabrication can include any suitable amount of the other cationic photoinitiator or photosensitizer, for example, in certain embodiments, in an amount an amount from 0.1 to 10 wt % of the resin composition, in certain embodiments, from about 1 to about 8 wt % of the resin composition, and in further embodiments from about 2 to about 6 wt % of the resin composition. In an embodiment, the above ranges are particularly suitable for use with epoxy monomers.

In accordance with an embodiment, the liquid radiation curable resin for additive fabrication includes a photoinitiating system that is a photoinitiator having both cationic initiating function and free radical initiating function.

Free-Radical Photoinitiator

Typically, free radical photoinitiators are divided into those that form radicals by cleavage, known as "Norrish Type I" and those that form radicals by hydrogen abstraction, known as "Norrish type II". The Norrish type II photoinitiators require a hydrogen donor, which serves as the free radical source. As the initiation is based on a bimolecular reaction, the Norrrish type II photoinitiators are generally slower than Norrish type I photoinitiators which are based on the unimolecular formation of radicals. On the other hand, Norrish type II photoinitiators possess better optical absorption properties in the near-UV spectroscopic region. Photolysis of aromatic ketones, such as benzophenone, thioxanthones, benzil, and quinones, in the presence of hydrogen donors, such as alcohols, amines, or thiols leads to the formation of a radical produced from the carbonyl compound (ketyl-type radical) and another radical derived from the hydrogen donor. The photopolymerization of vinyl monomers is usually initiated by the radicals produced from the hydrogen donor. The ketyl radicals are usually not reactive toward vinyl monomers because of the steric hindrance and the delocalization of an unpaired electron.

To successfully formulate a liquid radiation curable resin for additive fabrication, it is necessary to review the wavelength sensitivity of the photoinitiator(s) present in the resin composition to determine if they will be activated by the radiation source chosen to provide the curing light.

In accordance with an embodiment, the liquid radiation curable resin for additive fabrication includes at least one free radical photoinitiator, e.g., those selected from the group consisting of benzoylphosphine oxides, aryl ketones, benzophenones, hydroxylated ketones, 1-hydroxyphenyl ketones, ketals, metallocenes, and any combination thereof.

In an embodiment, the liquid radiation curable resin for additive fabrication includes at least one free-radical photoinitiator selected from the group consisting of 2,4,6-trimethylbenzoyl diphenylphosphine oxide and 2,4,6-trimethylbenzoyl phenyl, ethoxy phosphine oxide, bis(2,4,6-trimethylbenzoyl)-phenylphosphineoxide, 2-methyl-1-[4-(methylthio)phenyl]-2-morpholinopropanone-1,2-benzyl-2-(dimethylamino)-1-[4-(4-morpholinyl)phenyl]-1-butanone, 2-dimethylamino-2-(4-methyl-benzyl)-1-(4-morpholin-4-yl-phenyl)-butan-1-one, 4-benzoyl-4'-methyl diphenyl sulphide, 4,4'-bis(diethylamino) benzophenone, and 4,4'-bis(N,N'-dimethylamino) benzophenone (Michler's ketone), benzophenone, 4-methyl benzophenone, 2,4,6-trimethyl benzophenone, dimethoxybenzophenone, 1-hydroxycyclohexyl phenyl ketone, phenyl (1-hydroxyisopropyl)ketone, 2-hydroxy-1-[4-(2-hydroxyethoxyl)phenyl]-2-methyl-1-propanone, 4-isopropylphenyl(1-hydroxyisopropyl)ketone, oligo-[2-hydroxy-2-methyl-1-[4-(1-methylvinyl)phenyl]propanone], camphorquinone, 4,4'-bis(diethylamino) benzophenone, benzil dimethyl ketal, bis(eta 5-2-4-cyclopentadien-1-yl) bis[2,6-difluoro-3-(1H-pyrrol-1-yl)phenyl] titanium, and any combination thereof.

For light sources emitting in the 300-475 nm wavelength range, especially those emitting at 365 nm, 390 nm, or 395 nm, examples of suitable free-radical photoinitiators absorbing in this area include: benzoylphosphine oxides, such as, for example, 2,4,6-trimethylbenzoyl diphenylphosphine oxide (Lucirin TPO from BASF) and 2,4,6-trimethylbenzoyl phenyl, ethoxy phosphine oxide (Lucirin TPO-L from BASF), bis(2,4,6-trimethylbenzoyl)-phenylphosphineoxide (Irgacure 819 or BAPO from Ciba), 2-methyl-1-[4-(methylthio)phenyl]-2-morpholinopropanone-1 (Irgacure 907 from Ciba), 2-benzyl-2-(dimethylamino)-1-[4-(4-morpholinyl)phenyl]-1-butanone (Irgacure 369 from Ciba), 2-dimethylamino-2-(4-methyl-benzyl)-1-(4-morpholin-4-yl-phenyl)-butan-1-one (Irgacure 379 from Ciba), 4-benzoyl-4'-methyl diphenyl sulphide (Chivacure BMS from Chitec), 4,4'-bis(diethylamino) benzophenone (Chivacure EMK from Chitec), and 4,4'-bis(N,N'-dimethylamino) benzophenone (Michler's ketone). Also suitable are mixtures thereof.

Additionally, photosensitizers are useful in conjunction with photoinitiators in effecting cure with LED light sources emitting in this wavelength range. Examples of suitable photosensitizers include: anthraquinones, such as 2-methylanthraquinone, 2-ethylanthraquinone, 2-tertbutylanthraquinone, 1-chloroanthraquinone, and 2-amylanthraquinone, thioxanthones and xanthones, such as isopropyl thioxanthone, 2-chlorothioxanthone, 2,4-diethylthioxanthone, and 1-chloro-4-propoxythioxanthone, methyl benzoyl formate (Darocur MBF from Ciba), methyl-2-benzoyl benzoate (Chivacure OMB from Chitec), 4-benzoyl-4'-methyl diphenyl sulphide (Chivacure BMS from Chitec), 4,4'-bis(diethylamino) benzophenone (Chivacure EMK from Chitec).

It is possible for UV radiation sources to be designed to emit light at shorter wavelengths. For light sources emitting at wavelengths from between about 100 and about 300 nm, it is possible to employ a photosensitizer with a photoinitiator. When photosensitizers, such as those previously listed are present in the formulation, other photoinitiators absorbing at shorter wavelengths can be used. Examples of such photoinitiators include: benzophenones, such as benzophenone, 4-methyl benzophenone, 2,4,6-trimethyl benzophenone, dimethoxybenzophenone, and 1-hydroxyphenyl ketones, such as 1-hydroxycyclohexyl phenyl ketone, phenyl (1-hydroxyisopropyl)ketone, 2-hydroxy-1-[4-(2-hroxyethoxy)phenyl]-2-methyl-1-propanone, and 4-isopropylphenyl(1-hydroxyisopropyl)ketone, benzil dimethyl ketal, and oligo-[2-hydroxy-2-methyl-1-[4-(1-methylvinyl)phenyl]propanone] (Esacure KIP 150 from Lamberti).

Radiation sources can also be designed to emit at higher wavelengths. For radiation sources emitting light at wavelengths from about 475 nm to about 900 nm, examples of suitable free radical photoinitiators include: camphorquinone, 4,4'-bis(diethylamino) benzophenone (Chivacure EMK from Chitec), 4,4'-bis(N,N'-dimethylamino) benzophenone (Michler's ketone), bis(2,4,6-trimethylbenzoyl)-phenylphosphineoxide ("BAPO," or Irgacure 819 from Ciba), metallocenes such as bis (eta 5-2-4-cyclopentadien-1-yl) bis[2,6-difluoro-3-(1H-pyrrol-1-yl)phenyl]titanium (Irgacure 784 from Ciba), and the visible light photoinitiators from Spectra Group Limited, Inc. such as H-Nu 470, H-Nu-535, H-Nu-635, H-Nu-Blue-640, and H-Nu-Blue-660.

In one embodiment of the instant claimed invention, the light emitted by the radiation source is UVA radiation, which is radiation with a wavelength between about 320 and about 400 nm. In one embodiment of the instant claimed invention, the light emitted by the radiation source is UVB radiation, which is radiation with a wavelength between about 280 and about 320 nm. In one embodiment of the instant claimed invention, the light emitted by the radiation source is UVC radiation, which is radiation with a wavelength between about 100 and about 280 nm.

The liquid radiation curable resin for additive fabrication can include any suitable amount of the free-radical photoinitiator as component (d), for example, in certain embodiments, in an amount up to about 10 wt % of the resin composition, in certain embodiments, from about 0.1 to about 10 wt % of the resin composition, and in further embodiments from about 1 to about 6 wt % of the resin composition.

Fillers

The liquid radiation curable composition for additive fabrication according to the present invention also comprises at least one filler. Inorganic substances are especially preferred as fillers because of their tendency to impart water-resistance, heat-resistance, and robust mechanical properties into the cured, solid three-dimensional parts made therefrom.

In an embodiment, a filler of which the particles are spherical—herein defined as having a sphericity of 0.80 or greater—is used, because of the improved molding properties and accuracy they impart into three dimensional objects made of the prepared resin composition of the present invention.

Sphericity, also known as the "degree of circularity", is a ratio that measures the deviation of a spherical object from being a perfect sphere, and is defined by formula (III). When the shape of a projected image is exactly spherical, the sphericity is defined as 1. Sphericity may be calculated by the following formula (III):

$$\text{Sphericity} = \frac{\sqrt{4\pi S_p}}{C} = \frac{d_{pa}}{d_{pc}} \quad (III)$$

wherein $S_p$ is a projection area, C is the peripheral length of the projected image, $d_{pa}$ is the diameter of a circle having the same area as that of the projection area, and $d_{pc}$ is the diameter of a circle having the same peripheral length as the projected image of the particle.

This sphericity can be measured using an image analyzer which can analyze a microphotograph taken by a scanning electron microscope (SEM). The average sphericity can be measured by calculating the average sphericity of 100 particles arbitrarily selected from a multitude of particles appearing in the microphotograph.

In an embodiment of the invention, the filler is inorganic and comprises ceramics such as silica ($SiO_2$) nanoparticles, i.e., those particles having a mean particle size of from between 1 nanometer (nm) to 999 nm, or microparticles, i.e., those particles having a mean particle size of between 1 micrometer (μm) to 999 μm. Average particle size may be measured using laser diffraction particle size analysis in accordance with ISO13320:2009. A suitable device for measuring the average particle diameter of nanoparticles is the LB-550 machine, available from Horiba Instruments, Inc, which measures particle diameter by dynamic light scattering.

The nanoparticles or microparticles may be substantially silica based powders, for instance, greater than 85 wt %, more preferably 90 wt %, more preferably 95 wt % of silica ($SiO_2$).

Certain non-limiting examples of commercially available silica powder products include Crystallite 3K-S, Crystallite NX-7, Crystallite MCC-4, Crystallite CMC-12, Crystallite A-1, Crystallite AA, Crystallite C, Crystallite D, Crystallite CMC-1, Crystallite C-66, Crystallite 5X, Crystallite 2A-2, Crystallite VX-S2, Crystallite VX-SR, Crystallite VX-X, Crystallite VX-S, HUSELEX RD-8, HUSELEX RD-120, HUSELEX MCF-4, HUSELEX GP-200T, HUSELEX ZA-30, HUSELEX RD-8, HUSELEX Y-40, HUSELEX E-2, HUSELEX Y-60, HUSELEX E-1, HUSELEX E-2, HUSELEX FF, HUSELEX X, HUSELEX ZA-20, IMSIL A-25, IMSIL A-15, IMSIL A-10, and IMSIL A-8, (Ryushin Co., Ltd.); ORGANOSILICASOL™ MEK-EC-2102, ORGANOSILICASOL™ MEK-EC-2104, ORGANOSILICASOL™ MEK-AC-2202, ORGANOSILICASOL™ MEK-AC-4101, ORGANOSILICASOL™ MEK-AC-5101, ORGANOSILICASOL™ MIBK-SD, ORGANOSILICASOL™ MIBK-SD-L, ORGANOSILICASOL™ DMAC-ST, ORGANOSILICASOL™ EG-ST, ORGANOSILICASOL™ IPA-ST, ORGANOSILICASOL™ IPA-ST-L, ORGANOSILICASOL™ IPA-ST-L-UP, ORGANOSILICASOL™ IPA-ST-ZL, ORGANOSILICASOL™ MA-ST-M, ORGANOSILICASOL™ MEK-ST, ORGANOSILICASOL™ MEK-ST-L, ORGANOSILICASOL™ MEK-ST-UP, ORGANOSILICASOL™ MIBK-ST, ORGANOSILICASOL™ MT-ST, ORGANOSILICASOL™ NPC-ST-30, ORGANOSILICASOL™ PMA-ST, SUNSPHERE H-31, SUNSPHERE H-32, SUNSPHERE H-51, SUNSPHERE H-52, SUNSPHERE H-121, SUNSPHERE H-122, SUNSPHERE L-31, SUNSPHERE L-51, SUNSPHERE L-121, SUNSPHERE NP-30, SUNSPHERE NP-100, and SUNSPHERE NP-200 (Asahi Glass Co., Ltd.); Silstar MK-08 and MK-15 (Nippon Chemical Industrial Co., Ltd.); FB-48 (Denki Kagaku Kogyo K.K.); Nipsil SS-10, Nipsi:L SS-15, Nipsil SS-10A, Nipsil SS-20, Nipsil SS-30P, Nipsil SS-30S, Nipsil SS-40, Nipsil SS-50, Nipsil SS-50A, Nipsil SS-70, Nipsil SS-100, Nipsil SS-10F, Nipsil SS-50F, Nipsil SS-50B, Nipsil SS-50C, Nipsil SS-72F, Nipsil SS-170X, Nipsil SS-178B, Nipsil E150K, Nipsil E-150J, Nipsil E-1030, Nipsil ST-4, Nipsil E-170, Nipsil E-200, Nipsil E-220, Nipsil E-200A, Nipsil E-1009, Nipsil E-220A, Nipsil E-1011, NipsilE-K300, Nipsil HD, Nipsil HD-2, Nipsil N-300A, Nipsil L-250, Nipsil G-300, Nipsil E-75, Nipsil E-743, and Nipsil E-74P (Nippon Silica Industry, Ltd.). Please see U.S. Pat. No. 6,013,714 for further examples of silica particles.

In other embodiments of the invention, alternative inorganic filler substances may be used, such as those containing glass or metal particles. Certain non-limiting examples of such substances include: glass powder, alumina, alumina hydrate, magnesium oxide, magnesium hydroxide, barium sulfate, calcium sulfate, calcium carbonate, magnesium carbonate, silicate mineral, diatomaceous earth, silica sand, silica powder, oxidation titanium, aluminum powder, bronze, zinc powder, copper powder, lead powder, gold powder, silver dust, glass fiber, titanic acid potassium whiskers, carbon whiskers, sapphire whiskers, verification rear whiskers, boron carbide whiskers, silicon carbide whiskers, and silicon nitride whiskers.

Certain non-limiting examples of such other commercially available inorganic filler products include Glass bead GB210, GB210A, GB210B, GB210C, GB045Z, GB045ZA, GB045ZB, GB045ZC, GB731, GB731A, GB731B, GB731C, GB731M, GB301S, EGB210, EGB210A, EGB210B, EGB210C, EGB045Z, EGB045ZA, EGB045ZB, EGB045ZC, MB-10, MB-20, EMB-10, EMB-20, HSC070Q, HSC-024X, HSC-080S, HSC-070G, HSC-075L, HSC-110, HSC-110A, HSC-110B, and HSC-110C (Toshiba Balotini Co., Ltd.); Radiolite #100, Radiolite Fine Flow B, Radiolite Fine Flow A, Radiolite Sparkle Flow, Radiolite Special Flow, Radiolite #300, Radiolite #200, Radiolite Clear Flow, Radiolite #500, Radiolite #600, Radiolite #2000, Radiolite #700, Radiolite #500S, Radiolite #800, Radiolite #900, Radiolite #800S, Radiolite #3000, Radiolite Ace, Radiolite Superace, Radiolite High Ace, Radiolite PC-1, Radiolite Delux P-5, Radiolite Delux W50, Radiolite Microfine, Radiolite F, Radic)lite SPF, Radiolite GC, Topco #31, Topco #34, Topco #36, Topco #38, and Topco #54 (Showa Chemical Industry Co., Ltd.); Higilite H-X, Higilite H-21, Higilite H-31, Higilite H-32, Higilite H-42, Higilite H-42M, Higilite H-43, Higilite H-32ST, Higilite H-42STV, Higilite H-42T, Higilite H-34, Higilite H-34HL, Higilite H-32I, Higilite H-42I, Higilite H-425, Higilite H-210, Higilite H-310, Higilite H-320, Higilite H-141, Higilite H-241, Higilite H-341, Higilite H-3201, Higilite H-320ST, Higilite HS-310, Higilite HS-320, Higilite HS-341, Alumina A-426, alumina A-42-1, Alumina A-42-2, Alumina A-42-3, Alumina A-420, Alumina A-43M, Alumina A-43-L, Alumina A-50-K, Alumina A-50-N, Alumina A-50-F, Alumina AL-45-H, Alumina AL-45-2, Alumina AL-45-1, Alumina AL-43-M, Alumina AL-43-L, Alumina AL-43PC, Alumina AL-150SG, Alumina AL-170, Alumina A-172, Alumina A-173, Alumina AS10, Alumina AS-20, Alumina AS-30, Alumina AS-40, and Alumina AS-50 (Showa Denko K.K.); Starmague U, Starmague M, Starmague L, Starmague P, Starmague C, Starmague CX, High purity magnesia HP-10, High purity magnesia HP-10N, High purity magnesia HP-30, Star brand-200, Star brand-10, Star brand-10A, Star brand magnesium carbonate Venus, Star brand magnesium carbonate two stars, Star brand magnesium carbonate one star, Star brand magnesium carbonate S, Star brand magnesium carbonate Fodder, Star brand heavy magnesium carbonate, High purity magnesium carbonate GP-10, High purity magnesium carbonate 30, Star brand light calcium carbonate general use, Star brand light calcium carbonates EC, and Star brand light calcium carbonate KFW-200 (Konoshima Chemical Industry Co., Ltd.); MKC Silica GS50Z and MKC Silica SS-15 (Mitsubishi Chemical Corp.), Admafine SOE-E3, Admafine SO-C3, Admafine AO-800, Admafine AO-809, Admafine AO-500, and Admafine AO-509 (Adomatex Co., Ltd.); M. S. GEL D-560A, M. S. GEL D-5120A, M. S. GEL D-5300A, M. S. GEL D-2060A, M. S. GEL D-20120A, M. S. GEL D-20-300A, SILDE-X H-31, SELDEX H-32, SILDEX H-51, SILDEX H-52, SILDEX H-121, SILDEX H-122, SILDEX L-31, SILDEX L-51, SILDEX L-121, SILD EX F-51, and SILDEX F-121 (Asahi Glass); SYLYSIA 250, SYLYSIA 250N, SYLYSIA 256, SYLYSIA 256N, SYLYSIEA 310, SYLYSIA 320, SYLYSIA 350, SYLYSIA 358, SYLYSIA 430, SYLYSIA 431, SYLYSIA 440, SYLYSIA 450, SYLYSIA 470, SYLYSIA 435, SYLYSIA 445, SYLYSIA 436, SYLYSIA 446, SYLYSIA 456, SYLYSIA 530, SYLYSIA 540, SYLYSIA 550, SYLYSIA 730, SYLYSIA 740, SYLYSIA 770, SYLOPHOBIC100, and SYLOPHOBIC 200 (Fuji Silysia Chemical Co., Ltd.); and Tismo-D, Tismo-L, Tofica Y, Tofica YN, Tofica YB, Dendol WK-200, Dendol WK-200B, Dendol WK-300, Dendol BK-200, Dendol BK-300, Swanite, and Barihigh B Super Dendol (Otsuka Chemical Co., Ltd.).

The inorganic fillers may also be surface treated with a silane coupling agent. Silane coupling agents which can be used for this purpose include vinyl triclorosilane, vinyl tris (β-methoxyethoxy) silane, vinyltriethoxy silane, vinyltrimethoxy silane, γ-(methacryloxypropyl) trimethoxy silane, β-(3,4-epoxycyclohexyl)ethyltrimethoxy silane, γ-glycydoxypropyltrimethoxy silane, γ-glycydoxypropylmethyl diethoxy silane, N-β(aminoethyl)yaminopropyltrimethoxy silane, N-β-(aminoethyl)-γ-aminopropylmethyldimethoxy silane, γ-aminopropyltriethoxysilane, N-phenyl-γ-amino propyl trimethoxy silane, γ-mercaptopropyl trimethoxysilane, and γ-chloropropyltrimethoxy silane.

The condition of the surface of the particles of the filler used and the impurities contained in filler from the fabrication process can affect the curing reaction of the resin composition. In such cases, it is preferable to wash the filler particles or coat the particles with an appropriate primer as a method of improving the curing properties. The inventors have also noted that certain fillers tend to contribute to a particularly marked reduction in viscosity stability. Without wishing to be bound by any particular theory, a hypothesized cause for this phenomenon is the presence of residual acids present amongst the particles of such fillers, which are an unwanted but often unavoidable byproduct of the manufacturing process used to create them. These residual acids will react with cationically polymerizable components in the surrounding resin, resulting in partial polymerization and an increase in viscosity over time.

The liquid radiation curable resin for additive fabrication can include any suitable amount of inorganic filler or combination of fillers as component (e), for example, in an amount up to about 80 wt % of the resin composition, in certain embodiments from about 30 to about 80 wt % of the resin composition, and in further embodiments from about 50 to about 70 wt % of the resin composition. If the amount of the component (e) is too small, the water and heat resistant properties, durability, and structural rigidity of the molds made of the prepared resin composition do not increase sufficiently. On the other hand, if the amount of the component (e) is too large, the fluidity of the prepared resin composition becomes too low, rendering it difficult or even un-workable in additive fabrication processes. The excessive amount of the component (e) can also affect the time needed for radiation curing of the resin composition, causing the processing time to increase substantially.

Filled Matrix

The above inorganic fillers may be used singly or in combination of two or more. As has been generally known to those skilled in the art, by using inorganic fillers with different properties in combination, it is possible to impart certain properties derived from the fillers to the prepared resin composition. Further, the prepared resin composition can have different viscosities if the average grain size or fiber length, or the grain size or fiber length distribution of the inorganic filler used is different, though the substance and amount are the same. Therefore, by appropriately determining not only the average particle size or fiber length but also the particle size or fiber length distribution, or by using inorganic fillers of the same substance with different average particle sizes or fiber lengths in combination, the necessary amount of the filler and the fluidity and other properties of the prepared resin can be controlled as desired.

Presently, inventors have now surprisingly found that certain filled "matrices" are able to contribute to the formation of sufficiently robust three-dimensional solid parts yet stabilize the liquid radiation curable composition for additive fabrication to impart improved resistance to: (1) an unwanted particle settling into a soft pack or hard pack, and (2) an increase in viscosity over time. Such compositions are henceforth referred to as "optimally stabilized". For the purposes herein, "matrices" are defined as arrangements of inorganic filler constituents of varying sizes, substances, and/or size distributions which form a suspended solid lattice or backbone in a liquid radiation curable composition for additive fabrication. A matrix of the present invention contains at least two constituents: (1) a microparticle constituent that comprises a plurality of inorganic particles largely defining the structure of the matrix; and (2) a nanoparticle constituent that comprises a plurality of inorganic particles which fill gaps between successive microparticles in order to form a more fully filled matrix.

The microparticle constituent contains inorganic microparticles having an average particle size or fiber length of from about 1 to about 999 micrometers (μm), more preferably from about 1 to about 50 μm, more preferably from about 1 to about 10 μm, as measured in accordance with ISO13320: 2009. In an embodiment of the invention, the microparticle constituent is spherical silica powder, such as of fused or crystal silica. In an embodiment of the invention, the microparticles of the microparticle constituent possess an average particle size or fiber length of from about 2 to about 8 μm.

The nanoparticle constituent contains inorganic nanoparticles having an average particle size or fiber length of from about 1 to about 999 nanometers (nm), more preferably from about 20 to about 200 nm, more preferably from about 50 to about 100 nm, as measured in accordance with ISO13320: 2009. In an embodiment of the invention, the nanoparticle constituent is spherical silica powder, such as fused or crystal silica, and possesses an average particle size or fiber length of from about 50 to about 100 nm.

The microparticle constituent or nanoparticle constituent of the present invention may possess any particle size distribution. Thus, a constituent may be deemed to fall within a range as herein described even though the "tails" of a particular particle size distribution fall outside that stated range, so long as the mean particle size falls within it.

Figure 2:
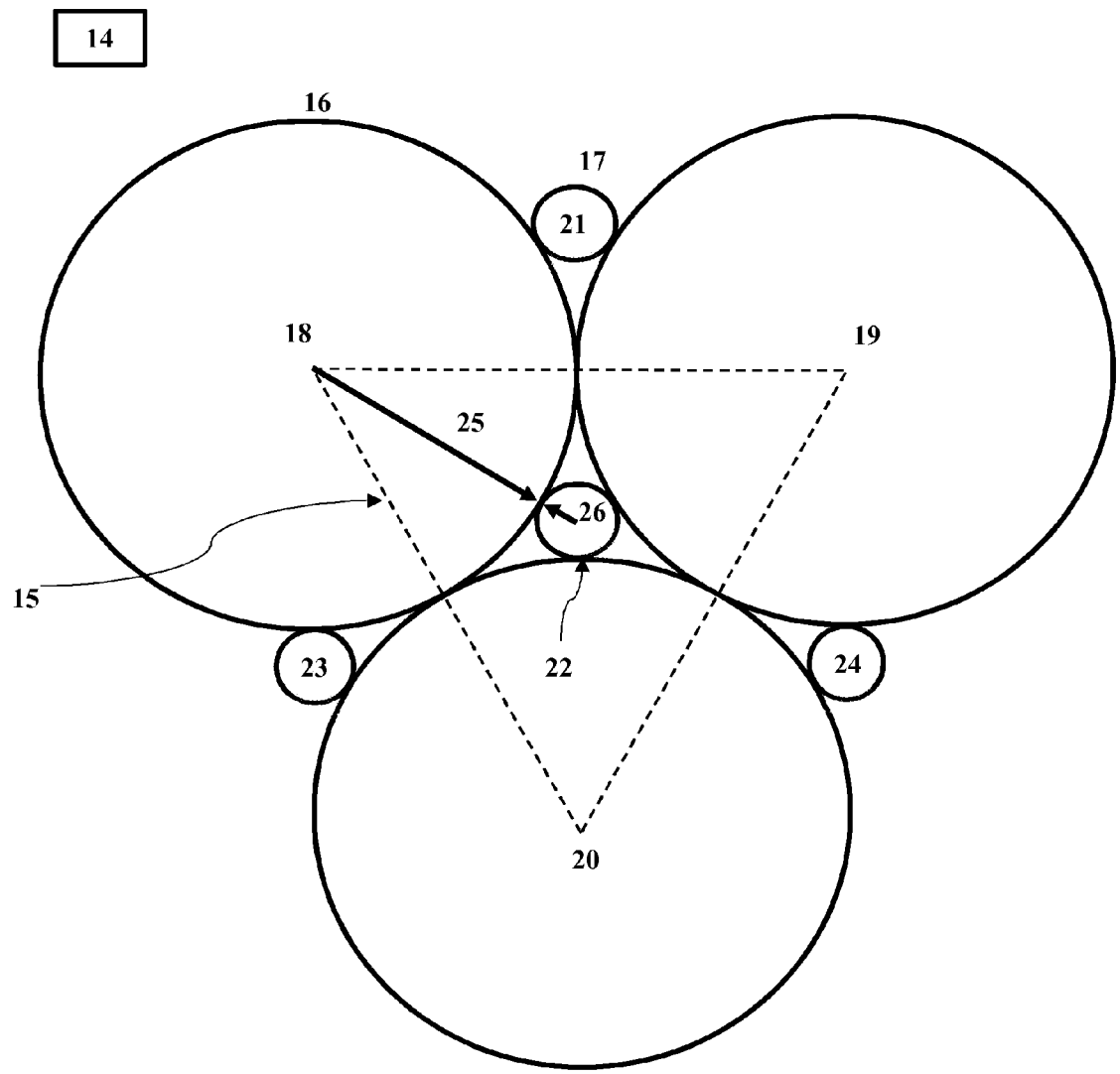
FIG. 2 depicts a two-dimensional cross-sectional view of an embodiment of a triangular configuration filled matrix of the present invention.

Such particle sizes notwithstanding, inventors have discovered that optimally stabilized compositions may be achieved by selecting appropriately-sized microparticle and nanoparticle constituents relative to each other. A derivation of the lower bound of the ratio of average particle size of the microparticles in the microparticle constituent to the nanoparticles in the nanoparticle constituent in an embodiment of the invention is depicted in FIGS. 1 and 2. As FIGS. 1 and 2 represent specific matrix configurations, they are merely examples and are not intended to limit the scope of the invention. FIG. 1 depicts a two-dimensional cross section of a square configuration filled matrix 1. The square configuration filled matrix 1 includes a microparticle constituent 3 and a nanoparticle constituent 4. The microparticle constituent 3 further comprises individual spherical microparticles 7, 8, 9, and 10, whereas the nanoparticle constituent 4 comprises spherical nanoparticles 11, 12, and 13. An imaginary square 2 encompasses the centerpoints of the microparticles 7, 8, 9, and 10 to demonstrate more clearly the square configuration of the filled matrix. In order to ensure the possibility of a tightly packed, stabilized matrix, the nanoparticle radius 6 can only be large enough to form a nanoparticle which is tangential to the four surrounding, contacting microparticles. Thus the minimum ratio of the microparticle radius 5 to the nanoparticle radius 6 in such a configuration can be derived using the Pythagorean Theorem $a^2+b^2=c^2$, where a and b are equal to the microparticle radius 5, and c is equal to combined value of the microparticle radius 5 and the nanoparticle radius 6. Simplifying the expression yields $c=\sqrt{2}$, or further that the nanoparticle radius 6 is equal to ($\sqrt{2}-1$) times the value of the microparticle radius 5. Thus in this configuration, the minimum ratio of the average particle size of the microparticle constituent to the average particle size of the nanoparticle constituent is $$\frac{1}{\sqrt{2}-1},$$

or approximately 2.41:1.

An alternative, more tightly-packed embodiment is depicted in FIG. 2. FIG. 2 involves a two-dimensional cross section of a triangular configuration filled matrix 14. The triangular configuration filled matrix 14 includes a microparticle constituent 16 and a nanoparticle constituent 17. The microparticle constituent 16 further comprises spherical microparticles 18, 19, and 20, whereas the nanoparticle constituent 17 comprises spherical nanoparticles 21, 22, 23, and 24. An imaginary equilateral triangle 15 encompasses the centerpoints of the microparticles 18, 19, and 20, to demonstrate more clearly the triangular configuration of the filled matrix. In order to ensure the possibility of a tightly packed, stabilized matrix, the nanoparticle radius 26 can only be large enough to form a nanoparticle which is tangential to the three surrounding, contacting microparticles. Thus the minimum ratio of the microparticle radius 25 to the nanoparticle radius 26 in such a configuration can be derived using trigonometry, wherein the nanoparticle radius 26 is equal to the expression $$\frac{r}{\cos 30°}-r,$$

where r is equal to the microparticle radius 25. Thus in this configuration, the minimum ratio of the average particle size of the microparticles in the microparticle constituent to the nanoparticles in the nanoparticle constituent is $$\frac{1}{\frac{r}{\cos 30°}-r},$$

or approximately 6.46:1.

Thus, in an embodiment according to the present invention, the ratio of the average particle size of the microparticles in the microparticle constituent to the nanoparticles in the nanoparticle constituent is from about 2.41:1 to about 2,000:1, more preferably from about 2.41 to about 200:1, more preferably from about 6.46:1 to about 200:1, even more preferably from about 6.46:1 to about 100:1. Ratios whereby the size of the average particle size of the microparticles in the microparticle constituent to the nanoparticles in the nanoparticle constituent exceeds these figures tend to produce unwieldy matrices that raise the viscosity of the overall composition with which they are associated, or, due to an excessive average microparticle size, they do not enable sufficient resolution of solid parts cured therefrom. They may also contribute to unstable filled matrices which readily disintegrate into a soft pack.

The inventors have also surprisingly discovered that liquid radiation curable resin compositions for additive fabrication may become optimally stabilized when the ratio by weight of the microparticle constituent to the nanoparticle constituent is from greater than about 1:1 to about 12:1, more preferably from about 4:1 to about 8:1. Compositions having lower weight ratios tend not to form a matrix imparting sufficient mechanical rigidity and strength to the solid part upon curing. Conversely, those compositions having a microparticle constituent which comprises too large a weight percentage of the total filled matrix tend to form an unstable matrix which rapidly breaks down, causing the inorganic filler to settle into an unwanted hard or soft pack.

Additionally, inventors have discovered that the density of the constituents of the filled matrices also can contribute to formulation of an optimally stabilized composition. Thus, inventors have also discovered that liquid radiation curable resin compositions for additive fabrication may also become optimally stabilized when the ratio by volume of the microparticle constituent to the nanoparticle constituent is from greater than about 1:1 to about 12:1, more preferably from about 4:1 to about 8:1. Compositions having lower volume ratios tend not to form a matrix imparting sufficient mechanical strength to the mold upon curing. Conversely, those compositions having a microparticle constituent which comprises too large a percentage by volume of the total filled matrix tend to form an unstable matrix which rapidly breaks down, causing the inorganic filler to settle into an unwanted hard or soft pack.

Furthermore, the inventors have discovered that the respective numbers of particles of the constituents of the filled matrices also can contribute to formulation of an optimally stabilized composition. Although matrices of the present invention may possess a greater amount of the microparticle constituent than the nanoparticle constituent by weight, they often possess a greater number of individual nanoparticles than microparticles, due to the markedly smaller weight of each nanoparticle. Thus, inventors have also discovered that filled liquid radiation curable compositions for additive fabrication may also become optimally stabilized when the ratio by number of the total amount of nanoparticles in the nanoparticle constituent to the total amount of microparticles in the microparticle constituent present is from about 50:1 to about 1,000,000:1, more preferably from about 5,000:1 to about 50,000:1. Compositions having too few or too many relative number of nanoparticles to microparticles tend to form an unstable matrix which can break down, causing the inorganic filler to settle into a hard or soft pack.

It is understood that the number of particles and overall volume of a matrix constituent may vary depending on the matrix constituent's particle size distribution. It is nonetheless assumed herein that for purposes of calculating the "ratio by volume" or "ratio by number" that all of the particles present for a given constituent possess the mean particle size for that constituent, as determined by ISO13320:2009.

The aforementioned fillers, sizes, combinations, and ratios of filled constituents form optimally stabilized compositions because they prescribe filled matrices which maintain their original structure over time, and resist ancillary polymerization. Although not wishing to be bound by any theory, it is hypothesized that such filled matrices achieve this technical effect because they are stabilized both mechanically and chemically. That is, certain ratios of filled inorganic constituents in a matrix prevent the matrix from disintegrating because the individual particles are physically prevented from significant movement or sedimentation due to proper arrangements of interlocking microparticles and nanoparticles. Additionally, such sedimentation is further prevented because the constituents of the filled matrices of the present invention are arranged so as to optimize the chemical bonds formed both between successive constituent particles, and also between the constituent particles and the surrounding liquid. This equilibrium of chemical bonds imparts additional stability and rigidity to the overall filled matrix. The inventors have discovered that such optimally stabilized resins exhibit improved resistance to settling and viscosity increase versus all other previously known filled liquid radiation curable compositions suitable for certain additive fabrication applications.

In addition to the aforementioned factors, inventors have also discovered the surprisingly significant effect that the particle dispersion pH further has on polymerization efficacy and viscosity stability of the resulting photocurable composition for additive fabrication into which it is ultimately incorporated. Particle dispersion pH is herein defined as the pH of the filled particle dispersion—that is, the pH of the solution incorporating two elements: the filler constituent (for example, the nanoparticle constituent or microparticle constituent) and the solvent into which the solid filler constituent is incorporated. Non-limiting examples of commonly-used such solvents include inert agents such as methyl ethyl ketone or isopropanol, or polymerizable agents such as epoxies, oxetanes, or (meth)acrylates. Such solvents may be employed singularly or in combination of two or more. Particle dispersion pH is measured prior to the incorporation of the filled particle dispersion into the liquid radiation curable resin composition for additive fabrication as a whole.

Inventors have discovered that if the particle dispersion pH falls within certain ranges, in particular the thermal stability of a liquid radiation curable composition for additive fabrication can be markedly improved. This is because the alkaline or acidic (as the case may be) nature of the filled particle dispersion causes it to interact with the pH of the entire surrounding resin, thereby influencing the efficacy and speed of the cationic polymerization reaction during an additive fabrication process. If the particle dispersion pH is too low, the resulting resin may become too acidic, thereby initiating polymerization reactions amongst the cationically curable components in the surrounding resin (such as epoxies and oxetanes) even in the absence of exposure to radiation. This unwanted effect in additive fabrication applications is particularly increased at elevated temperatures, and greatly contributes to an increase in viscosity of the resultant resin over time.

Conversely, if the particle dispersion pH is too high, the resulting resin becomes too alkaline, thereby inhibiting photopolymerization reactions altogether. In this scenario, the Brønsted acid species generated by the cationic photoinitiator component become neutralized by the basic nature of the filled particle dispersion before said Brønsted acid species can initiate any photopolymerization reaction. Because the presence of such Brønsted acid-generating species are necessary to initiate and propagate the ring-opening reaction which is emblematic of cationic polymerization, it is important that the particle dispersion pH is maintained sufficiently low.

In an embodiment, the particle dispersion pH is from 4.0 to 8.0. In another embodiment, the particle dispersion pH is from 5.5 to 7.5. In another embodiment, the particle dispersion pH is from 6.0 to 7.5. In another embodiment, the particle dispersion pH is greater than 5.5. In another embodiment, the particle dispersion pH is neutral, or about 7.0.

Notably, in prescribing filled matrices of the present invention, the inventors have arrived at liquid radiation curable compositions for additive fabrication that also possess lower initial viscosities than those previously contemplated as practical. Particularly, no compositions heretofore have been described that successfully combine a decreased initial viscosity with improved anti-sedimentation characteristics, given the longstanding belief of the inversely proportional relationship between those characteristics as they pertain to liquid radiation curable compositions for additive fabrication. Prior compositions might have been formulated for either low initial viscosity or anti-settling, but not both. Thus, it has heretofore been thought that formulating a low-viscosity composition was diametrically opposed to creating one that minimized or eliminated filler settling behavior, because of the belief that the relatively high density inorganic particles would rapidly phase separate when situated in a surrounding liquid medium of significantly lower density.

All things being equal, the viscosity of a liquid radiation curable composition for additive fabrication is inversely proportional to the average particle size of the filled particles immersed therein. Recognizing this principle, the inventors have contravened the longstanding belief that precipitation of the filler occurs when the viscosity of the prepared resin into which it is immersed becomes too low by prescribing particle sizes and ratios of the nanoparticle and microparticle constituents in a way according to the present invention so as to create a low-viscosity, yet optimally stable matrix. Thus, inventors have been able to formulate a matrix filled, liquid radiation curable resin for additive fabrication that surprisingly achieves a low initial viscosity, imparts sufficient mechanical properties in the cured parts derived therefrom, while simultaneously demonstrating improved anti-sedimentation and viscosity stability.

Stabilizers and Other Components

Stabilizers are often added to the resin compositions in order to further prevent a viscosity build-up, for instance a viscosity build-up during usage in a solid imaging process. Useful stabilizers include those described in U.S. Pat. No. 5,665,792, the entire disclosure of which is hereby incorporated by reference. In the instant claimed invention, the presence of a stabilizer is optional. In a specific embodiment, the liquid radiation curable resin composition for additive fabrication comprises from 0.1 wt % to 3% of a stabilizer.

If present, such stabilizers are usually hydrocarbon carboxylic acid salts of group IA and IIA metals. Most preferred examples of these salts are sodium bicarbonate, potassium bicarbonate, and rubidium carbonate. Solid stabilizers are generally not preferred in filled resin compositions. If present, a 15~23% sodium carbonate solution is preferred for formulations of this invention with recommended amounts varying between 0.05 to 3.0% by weight of resin composition, more preferably from 0.05 to 1.0 wt %, more preferably from 0.1 to 0.5% by weight of resin composition. Alternative stabilizers include polyvinylpyrrolidones and polyacrylonitriles.

Other possible additives include dyes, pigments, antioxidants, wetting agents, photosensitizers for the free-radical photoinitiator, chain transfer agents, leveling agents, defoamers, surfactants and the like.

The liquid radiation curable resin composition for additive fabrication of the invention can further include one or more additives selected from the group consisting of bubble breakers, antioxidants, surfactants, acid scavengers, pigments, dyes, thickneners, flame retardants, silane coupling agents, ultraviolet absorbers, resin particles, core-shell particle impact modifiers, soluble polymers and block polymers.

The second aspect of the claimed invention is a process of forming a three-dimensional object comprising the steps of forming and selectively curing a layer of the liquid radiation curable resin composition according to the present invention as described herein with actinic radiation and repeating the steps of forming and selectively curing a layer of the liquid radiation curable resin composition for additive fabrication as described herein a plurality of times to obtain a three-dimensional object.

As noted previously herein, it is preferred that filled liquid radiation curable compositions for additive fabrication have a low initial viscosity in order to maximize workability and minimize processing time. Therefore, it is preferred that liquid radiation curable compositions for additive fabrication according to the present invention have a viscosity, when measured at 30 degrees Celsius, of between 200 centipoise (cPs) and 2000 cPs, more preferably between 500 cPs and 1500 cPs, even more preferably between 600 cPs and 1200 cPs.

Furthermore, the filled composition must be able to impart sufficient strength and stiffness into the three dimensional solid objects which they form upon curing. Therefore, it is preferred that liquid radiation curable compositions for additive fabrication according to the present invention have a flexural modulus, after full cure with actinic radiation and a 60 minute UV and thermal postcure according to processes well-known in the art of additive fabrication and stereolithography (ASTM D648-98c), of at least 6,000 MPa, more preferably at least about 8,000 MPa, and even more preferably at least about 10,000 MPa. In an embodiment of the present invention, the flexural modulus achieved is between about 8,000 MPa and about 12,000 MPa.

Additionally, the filled composition must be able to impart sufficient resilience and integrity into three dimensional solid objects which they form upon curing, even after exposure to high heat conditions. Thus, it is preferred that the liquid radiation curable composition for additive fabrication according to the present invention, after full cure with actinic radiation and 60 minute UV and thermal postcure according to processes well-known in the art of additive fabrication and stereolithography (ASTM D648-98c), has a heat distortion temperature at 1.82 MPa of at least about 80 degrees Celsius, more preferably at least about 100 degrees Celsius, and more preferably at least about 110 degrees Celsius. In an embodiment of the present invention, the heat distortion temperature at 1.82 MPa is between about 80 degrees Celsius and about 120 degrees Celsius.

The third aspect of the claimed invention is the three-dimensional object formed from the liquid radiation curable resin of any one of the first aspect of the present invention, by the process of the second aspect of the claimed invention.

The fourth aspect of the claimed invention is a liquid radiation curable resin for additive fabrication comprising:
(f) a cationically polymerizable component;
(g) a (meth)acrylate component;
(h) a cationic photoinitiator;
(i) a free-radical photoinitiator; and
(j) a filled matrix, further comprising
  a filled particle dispersion containing
    a nanoparticle constituent made up of a plurality of silica nanoparticles having an average particle size of at least about 50 nanometers, and a solvent, and
  a microparticle constituent made up of a plurality of inorganic microparticles;
  wherein the ratio by weight of the microparticle constituent to the nanoparticle constituent is from about 1:1 to about 12:1; and
  wherein the filled particle dispersion has a particle dispersion pH of greater than about 5.5.

The following examples further illustrate the invention but, of course, should not be construed as in any way limiting its scope.

EXAMPLES

These examples illustrate embodiments of the liquid radiation curable resins for additive fabrication of the instant invention. Table 1 describes the various components of the liquid radiation curable resins for additive fabrication used in the present examples.

TABLE 1

| Component | Function in Formula | Chemical Descriptor | Supplier/Manufacturer |
|---|---|---|---|
| 4-methoxyphenol | Antioxidant | 4-methoxyphenol | Sigma-Aldrich |
| DG-0071 | Stabilizer | Saturated sodium carbonate in water solution | DSM Desotech |
| Aerosil 200 | Settling additive | Hydrophilic fumed silica | Evonik Industries |
| Chivacure 1176 | Cationic Photoinitiator | A mixture of: bis[4-diphenylsulfoniumphenyl]sulfide bishexafluoroantimonate; thiophenoxyphenylsulfonium hexafluoroantimonate and propylene carbonate. | Chitec |
| Irgacure 184 | Radical Photoinitiator | 1-Hydroxy-1-cyclohexyl phenyl ketone | BASF |
| DPHA | Radically Polymerizable Compound | Dipentaerythritol hexaacrylate | Sigma-Aldrich |
| Heloxy 68 | Cationically Polymerizable compound | Neopentylglycol diglycidyl ether | Momentive |
| Erisys GE 22 | Cationically Polymerizable Compound | 1,4 Cyclohexanedimethanol Diglycidyl Ether | Emerald Performance Materials |
| Celloxide 2021P | Cationic Polymerizable Compound | 3,4-Epoxycyclohexylmethyl 3',4'-epoxycyclohexanecarboxylate | Daicel Corporation |
| HQMME | Synthetic intermediate, uv inhibitor | Hydroquinone monomethyl ether | Nova International |
| SR 351 | Radically Polymerizable Compound | Trimethylolpropane triacrylate | Sartomer |
| ORGANO-SILICASOL MEK-AC-2101 | Filled particle dispersion including nanoparticle constituent | 30% colloidal silica nanoparticles in 70% methyl ethyl ketone solvent; 10-15 nm particle size distribution | Nissan Chemical |
| ORGANO-SILICASOL MEK-AC-4101 | Filled particle dispersion including nanoparticle constituent | 30% colloidal silica nanoparticles in 70% methyl ethyl ketone solvent; 40-50 nm particle size distribution | Nissan Chemical |
| ORGANO-SILICASOL MEK-AC-5101 | Filled particle dispersion including nanoparticle constituent | 30% colloidal silica nanoparticles in 70% methyl ethyl ketone solvent; 70-100 nm particle size distribution; 80 nm avg. particle size | Nissan Chemical |
| ORGANO-SILICASOL IPA-ST-ZL | Filled particle dispersion including nanoparticle constituent | 30% colloidal silica nanoparticles in Isopropanol solvent; 70-100 nm particle size distribution | Nissan Chemical |
| DZ-0077 | Filled particle dispersion including nanoparticle constituent | 40% colloidal silica nanoparticles in 60% 3,4-epoxycyclohexylmethyl 3',4'-epoxycyclohexanecarboxylate; 80 nm avg. particle size | Nanoparticles from Nissan Chemical; Epoxy from Daicel |
| Nanopox A 610 | Filled particle dispersion including nanoparticle constituent | 40% spherical silica nanoparticles in 60% 3,4-epoxycyclohexylmethyl 3',4'-epoxycyclohexanecarboxylate; 20 nm avg. particle size | Evonik Industries |
| Sunspacer 04.X | Filled particle dispersion including microparticle constituent | $SiO_2$ Particle (4 μm average particle size) | Suncolor |
| NP-30S | Filled particle dispersion including microparticle constituent | Spherical $SiO_2$ microparticles; 4 μm avg. particle size | AGC Chemicals |

Examples 1-12

Various filled liquid radiation curable resins for additive fabrication were prepared according to well-known methods in the art, employing a hybrid cure photoinitiating package, a cationically polymerizable package, a radically polymerizable package, and select additives. The MEK-AC-5101 nanoparticles are supplied in a methyl ethyl ketone solvent, which was exchanged for a cycloaliphatic epoxide—resulting in a 40% nanoparticle/60% epoxide solution—using standard techniques. Other resin compositions utilizing varying filled matrices were then prepared by alternating the type and/or quantity of microparticle constituent and nanoparticle constituent.

These samples were tested according to the methods for viscosity, settling behavior, shelf life thermal stability, and physical property testing, as detailed below. Finally, filled matrix characteristics were determined by calculating the ratio by weight, size, and volume of the microparticle constituent to the nanoparticle constituent, and the ratio by particle number of the nanoparticle constituent to the microparticle constituent. The results are presented in Table 2.

Viscosity

The viscosity of each sample was taken with an Anton Paar Rheoplus Rheometer (S/N 80325376) using a Z3/Q1 measuring cylinder (S/N 10571) with a 25 mm diameter. The temperature was set at 30° Celsius with a shear rate of 50 s$^{-1}$. The rotational speed was set at 38.5 min$^{-1}$. The measuring container was a H-Z3/SM cup (diameter 27.110 mm) which was filled with 21.4 grams of sample (enough to the spindle). Measurements were recorded in millipascal-seconds (mPa·s), but converted and reported herein as centipoise (cPs).

Settling Behavior of Filled Materials

Forty grams of each sample was measured into a glass petri dish and placed in a 50 degrees Celsius (C)±2 degrees C. oven. At the appropriate interval each sample was removed from the oven, and qualitatively examined for settling behavior. The behaviors observed were no settling, soft pack, or hard pack. Samples were then placed back into the oven to resume the test for the duration of the prescribed allotted time (typically 28 days). The duration at which the first indication of soft pack or hard pack settling behavior was observed was then recorded.

Viscosity Stability—Shelf Life Thermal Stability Test

Forty grams of each sample was measured and placed in a 50 degrees Celsius (C)±2 degrees C. oven. At the appropriate interval each sample was removed from the oven, then placed in a centrifuge at 2500 rpm for 1 minute (to remix any separation that might have occurred) and had the viscosity taken according the viscosity method. Samples were then placed back into the oven to resume the test for the duration of the prescribed allotted time (typically 28 days). Measurements were recorded in millipascal-seconds (mPa·s), but converted and reported herein as centipoise (cPs). Sections marked with an asterisk (*) indicates that because partial gelling of the sample had occurred, accurate readings were not obtainable.

Physical Property Testing

Samples were built by viper SLA machine (S/N 03FB0244 or S/N 02FB0160) to the standard Type I dogbone shape for tensile testing where the overall length is 6.5 inches, the overall width is 0.75 inch and the thickness is 0.125 inches and standard bar shape for the Flexural testing where the length is 5 inches, the overall width is 0.5 inch and the thickness is 0.125 inches. Samples were conditioned 7 days at 23° C. at 50% relative humidity. The tensile properties were tested according to the ASTM D638-10 test method. The flexural strength & modulus properties were tested according to the ASTM D 0790 test method. Both tests were performed on the 5G Sintech tensile tester (S/N 34359).

Ratios by Size, Weight, Volume, and Number

The ratio by size was derived by dividing the mean particle size of the microparticle constituent in a given composition by the mean particle size of the nanoparticle constituent in that composition. Mean particle sizes were determined from ISO13329:2009. Values expressed do not possess units.

The ratio by weight was derived by dividing the total amount by weight of the microparticle constituent in a given composition by the total amount by weight of the nanoparticle constituent in that composition. Values expressed do not possess units.

The ratio by volume was derived by dividing the total volume of the microparticle constituent in a given composition by the total volume of the nanoparticle constituent present in that composition. Volume for a constituent was determined by dividing the weight of that constituent by its density. Where, as in the examples below, both the microparticle constituent and nanoparticle constituent possess the same density, it should be noted that the ratio by volume does not differ from the ratio by weight. Values expressed do not possess units.

The ratio by number was derived by dividing the total number of nanoparticles present in the nanoparticle constituent by the total number of microparticles present in the microparticle constituent. Where, as in the examples below, spherical particles were used, for the sake of calculation, it was assumed that each matrix constituent was comprised entirely of spherical particles possessing a symmetric particle size distribution about the mean particle size. Thus, calculations were performed by first determining the volume of each spherical particle, which can be derived by the formula $V=4/3\pi r^3$, where r is the radius of the spherical particle. Next, the weight of each spherical particle was determined by multiplying the volume of each particle by its density. Where, as in the examples below, both the microparticle constituent and nanoparticle constituent possess the same density, the relative value of the density is immaterial to the ratio calculation. Finally, the value of the weight of each particle was divided by the total weight in the entire composition of the constituent of which that particle was included, to obtain the total number of particles present in the composition. Calculations were similarly performed on the other matrix constituents to determine the ratio of particles by number. Values expressed do not possess units.

TABLE 2

| | Values are listed in parts by weight | | | | | |
|---|---|---|---|---|---|---|
| | Formula | | | | | |
| Component | Example 1 | Example 2 | Example 3 | Example 4 | Example 5 | Example 6 |
| Aerosil 200 | 0.37 | 0.37 | 0.37 | 0.37 | 0.37 | 0.37 |
| Chivacure 1176 | 3.80 | 3.80 | 3.80 | 3.80 | 3.80 | 3.80 |

TABLE 2-continued

Values are listed in parts by weight

| | | | | | | |
|---|---|---|---|---|---|---|
| DPHA | 2.07 | 2.07 | 2.07 | 2.07 | 2.07 | 2.07 |
| Heloxy 68 | 7.500 | 7.500 | 7.500 | 7.500 | 7.500 | 7.500 |
| HQMME | 0.018 | 0.018 | 0.018 | 0.018 | 0.018 | 0.018 |
| IRGACURE 184 | 0.400 | 0.400 | 0.400 | 0.400 | 0.400 | 0.400 |
| SR 351 | 3.350 | 3.350 | 3.350 | 3.350 | 3.350 | 3.350 |
| DZ-0077 | 0 | 34.610 | 27.000 | 19.500 | 10.000 | 10.000 |
| Nanopox A 610 | 34.610 | 0 | 0 | 0 | 0 | 0 |
| Celloxide 2021P | 0 | 0 | 4.61 | 9.11 | 14.85 | 18.61 |
| NP-30 | 47.890 | 47.890 | 50.89 | 53.89 | 57.65 | 53.89 |
| TOTAL | 100.00 | 100.00 | 100.00 | 100.00 | 100.00 | 100.00 |
| Ratio by size (micro/nano) | 200:1 | 50:1 | 50:1 | 50:1 | 50:1 | 50:1 |
| Ratio by weight (micro/nano) | 3.46:1 | 3.46:1 | 4.71:1 | 6.91:1 | 14.41:1 | 13.47:1 |
| Ratio by volume (micro/nano) | 3.46:1 | 3.46:1 | 4.71:1 | 6.91:1 | 14.41:1 | 13.47:1 |
| Ratio by # (nano/micro) | 2,312,633:1 | 36,135:1 | 26,528:1 | 18,092:1 | 8,673:1 | 9,278:1 |
| Initial Viscosity | 2712 | 1171 | 1132 | 1225 | 1556 | 1315 |
| Viscosity, 1 week | 3698 | 1646 | 1630 | 1767 | 2307 | 1926 |
| Viscosity, 2 weeks | 4333 | 1733 | 1755 | 1721 | * | * |
| Viscosity, 3 weeks | 5072 | * | * | 1921 | * | * |
| Viscosity, 4 weeks | 6203 | * | * | * | * | * |
| Settling Behavior, type | Soft Pack | Soft Pack | Soft Pack | Soft Pack | Hard Pack | Hard Pack |
| Settling Behavior, timing (days) | 3 | 15 | 15 | 11 | 11 | 11 |

| | Formula | | | | | |
|---|---|---|---|---|---|---|
| Component | Example 7 | Example 8 | Example 9 | Example 10 | Example 11 | Example 12 |
| Aerosil 200 | 0.37 | 0.37 | 0.37 | 0.37 | 0.37 | 0.37 |
| Chivacure 1176 | 3.80 | 3.80 | 3.80 | 3.80 | 3.80 | 3.80 |
| DPHA | 2.07 | 2.07 | 2.07 | 2.07 | 2.07 | 2.07 |
| Heloxy 68 | 7.500 | 7.500 | 7.500 | 7.500 | 7.500 | 7.500 |
| HQMME | 0.018 | 0.018 | 0.018 | 0.018 | 0.018 | 0.018 |
| Irgacure 184 | 0.400 | 0.400 | 0.400 | 0.400 | 0.400 | 0.400 |
| SR 351 | 3.350 | 3.350 | 3.350 | 3.350 | 3.350 | 3.350 |
| DZ-0077 | 10.000 | 10.000 | 27.000 | 19.500 | 0 | 0 |
| Nanopox A 610 | 0 | 0 | 0 | 0 | 0 | 0 |
| Celloxide 2021P | 21.61 | 24.61 | 7.61 | 15.11 | 24.85 | 34.61 |
| NP-30 | 50.89 | 47.89 | 47.89 | 47.89 | 57.65 | 47.890 |
| TOTAL | 100.00 | 100.00 | 100.00 | 100.00 | 100.00 | 100.00 |
| Ratio by size (micro/nano) | 200:1 | 50:1 | 50:1 | 50:1 | Undefined | Undefined |
| Ratio by weight (micro/nano) | 12.72:1 | 11.97:1 | 4.43:1 | 6.14:1 | Undefined | Undefined |
| Ratio by volume (micro/nano) | 12.72:1 | 11.97:1 | 4.43:1 | 6.14:1 | Undefined | Undefined |
| Ratio by # (nano/micro) | 9,825:1 | 10,441:1 | 28,190:1 | 20,359:1 | 0 | 0 |
| Initial Viscosity | 1133 | 918.3 | 1036 | 936 | 2182 | 1098 |
| Viscosity, 1 week | 1619 | 1307 | 1408 | 1286 | 3370 | 1590 |
| Viscosity, 2 weeks | * | * | 1428 | * | * | * |
| Viscosity, 3 weeks | * | * | * | * | * | * |
| Viscosity, 4 weeks | * | * | * | * | * | * |
| Settling Behavior, type | Hard Pack | Hard Pack | Soft Pack | Soft Pack | Hard Pack | Hard Pack |
| Settling Behavior, timing | 11 | 11 | 15 | 15 | 11 | 11 |

Examples 13-20

Various base filled resin compositions for additive fabrication were prepared according to well-known methods in the art by combining a photoinitiating package, a cationically polymerizable package, a radically polymerizable package, and select additives. Other resin compositions utilizing varying filled matrices were then prepared by alternating the type and/or quantity of microparticle constituent and nanoparticle constituent. Additionally, a cationically polymerizable component was varied. These samples were tested according to the methods prescribed herein for viscosity and settling behavior. Finally, filled matrix characteristics were determined by calculating the ratio by weight and volume of the microparticle constituent to the nanoparticle constituent, and the ratio by particle number of the nanoparticle constituent to the microparticle constituent. The results are presented in Table 3.

TABLE 3

Values are listed in parts by weight

| Component | Ex. 13 | Ex. 14 | Ex. 15 | Ex. 16 | Ex. 17 | Ex. 18 | Ex. 19 | Ex. 20 |
|---|---|---|---|---|---|---|---|---|
| Aerosil 200 | 0.370 | 0.370 | 0.370 | 0.370 | 0.370 | 0.370 | 0.370 | 0.370 |
| DPHA | 2.070 | 2.070 | 2.070 | 2.070 | 2.070 | 2.070 | 2.070 | 2.070 |
| Heloxy 68 | 7.500 | | | 7.500 | 7.500 | | 7.500 | |
| Nanopox A 610 | 34.610 | 34.610 | 10.000 | | | | 10.000 | |
| NP-30 | 47.890 | 47.890 | 57.570 | 47.890 | 47.890 | 57.570 | 57.570 | 57.570 |
| SR 351 | 3.350 | 3.350 | 3.350 | 3.350 | 3.350 | 3.350 | 3.350 | 3.350 |
| Celloxide 2021P | | | 14.810 | | | 14.810 | 14.810 | 14.810 |
| DZ-0077 | | | | 34.610 | 34.610 | 10.000 | | 10.000 |
| Erisys GE 22 | | 7.500 | | | 7.500 | 7.500 | 7.500 | 7.500 |
| Chivacure 1176 + Irgacure 184 | 4.210 | 4.210 | 4.330 | 4.210 | 4.210 | 4.330 | 4.330 | 4.330 |
| TOTALS | 100.00 | 100.00 | 100.00 | 100.00 | 100.00 | 100.00 | 100.00 | 100.00 |
| Ratio by size (micro/nano) | 200:1 | 200:1 | 200:1 | 50:1 | 50:1 | 50:1 | 200:1 | 50:1 |
| Ratio by weight (micro/nano) | 3.46:1 | 3.46:1 | 14.39:1 | 3.46:1 | 3.46:1 | 14.39:1 | 14.39:1 | 14.39:1 |
| Ratio by volume (micro/nano) | 3.46:1 | 3.46:1 | 14.39:1 | 3.46:1 | 3.46:1 | 14.39:1 | 14.39:1 | 14.39:1 |
| Ratio by # (nano/micro) | 2,312,633:1 | 2,312,633:1 | 555,845:1 | 36,135:1 | 36,135:1 | 8,685:1 | 555,845:1 | 8,685:1 |
| Settling Behavior, type | Soft Pack | Soft Pack | Hard Pack | Soft Pack | Soft Pack | Hard Pack | Hard Pack | Hard Pack |
| Settling Behavior, timing | 11 | 11 | 18 | 28 | 18 | 7 | 11 | 2 |

Examples 21-24

Various filled particle dispersions were evaluated to determine the particle dispersion pH of the raw material (nanoparticle constituent plus solvent). Readings for each respective filled particle dispersion were taken at 20° C. Before use, the electrode probe of a Beckman Coulter Φ250 pH meter (Series #3527) was soaked in a pH 4 buffer solution overnight. The pH meter was calibrated with three standard pH buffer solutions (pH 4.0, 7.0, and 10.01) before taking measurements. The calibration method and pH reading were performed according to the meter's operation instructions (Beckman Φ200 Series Operation Manual, pp. 19-21). After calibration, the probe was cleaned with distilled water and then was gently tapped to remove any water residue. The glass was not wiped vigorously in order to avoid scratches and dehydration.

In order to accurately measure the particle dispersion pH of the raw material, it was necessary to first dissolve the filled particle dispersion into a testing carrier (itself consisting of a 3:2 ratio of distilled water to methanol). Thus, 8.33 g of each filled particle dispersion was dissolved into 43.75 g of the testing carrier.

Next, the electrode probe of the Beckman Φ250 pH meter was inserted into the above solution (filled particle dispersion plus testing carrier) to establish a first particle dispersion pH reading. With the reading recorded, the electrode probe was cleaned with a solution of 50% acetone and 50% isopropanol (IPA) followed by distilled water. This cleaning procedure was repeated between each of five separate readings taken for each sample. The above process was repeated for each of four samples. The average value of the five readings for each of the four samples is reproduced in Table 4 below.

TABLE 4

| Filled particle dispersion | Solvent | $SiO_2$ % | Particle Size Distribution (nm) | Particle dispersion pH |
|---|---|---|---|---|
| Ex. 21 | MEK-AC-2101 | MEK | 30 | 10-15 | 6.71 |
| Ex. 22 | MEK-AC-4101 | MEK | 30 | 40-50 | 4.59 |
| Ex. 23 | IPA-ST-ZL | IPA | 30 | 70-100 | 4.03 |
| Ex. 24 | MEK-AC-5101 | MEK | 30 | 70-100 | 7.34 |

Examples 25-29

New samples were then prepared by exchanging the original solvent in the same four commercially available filled particle dispersions used in examples 21-24 with a 3,4-epoxycyclohexylmethyl 3',4'-epoxycyclohexanecarboxylate solvent. This solvent exchange, accomplished according to standard techniques, resulted in a 40% silica nanoparticle/60% epoxide solution. The pH of these resulting filled particle dispersions were then recorded for each sample according to the technique illustrated in the discussion of Examples 21-24, supra, with the exception that instead of creating a 8.33:43.75 filled particle dispersion to test carrier solution, 6.25 g of the resulting filled particle dispersion was dissolved into 43.75 g of the testing carrier.

Next, the samples were subjected to a thermal aging test. To effectuate this test, the initial viscosity was first measured according to the viscosity testing procedure outlined in the discussion of examples 1-12, supra. After 7 days of aging in a 55° C. oven, samples were cooled to room temperature and remixed if nanoparticle settling was observed. Viscosity was then again measured according to the viscosity testing procedure outlined in the discussion of examples 1-12, supra.

TABLE 5

| Component | Ex. 25 | Ex. 26 | Ex. 27 | Ex. 28 | Ex. 29 |
|---|---|---|---|---|---|
| Celloxide 2021P | 0 | 60 | 60 | 60 | 60 |
| Nanopox A610 | 100 | 0 | 0 | 0 | 0 |
| MEK-AC-2101 (nanoparticle constituent only) | 0 | 40 | 0 | 0 | 0 |
| MEK-AC-4101 (nanoparticle constituent only) | 0 | 0 | 40 | 0 | 0 |
| IPA-ST-ZL (nanoparticle constituent only) | 0 | 0 | 0 | 40 | 0 |
| MEK-AC-5101 (nanoparticle constituent only) | 0 | 0 | 0 | 0 | 40 |
| Resulting particle dispersion pH (post solvent exchange) | 6.63 | 6.71 | 5.36 | 4.79 | 7.19 |
| Initial Viscosity | 2750 | 1553 | Gelled during solvent exchange | | 505 |
| Viscosity, 7 days | 5325 | 31000 | | | 526 |
| Viscosity Change (%) | 94% | 1922% | | | 4% |

Examples 30-31

Two filled liquid radiation curable resins for additive fabrication were prepared according to well-known methods in the art, employing an identical hybrid cure photoinitiating package, cationically polymerizable package, radically polymerizable package, and select additives. The only difference between the two samples was the identity of the nanoparticle constituent. $E_c$, $D_p$, and $E_{10}$ values were measured according to the working curve measurement procedure outlined below. Further, the samples were subjected to the thermal aging test outlined in the description of Examples 25-29, supra. Viscosity measurements were taken (according to the procedure outlined in the discussion of examples 1-12 herein, supra) at the beginning of the test, then again at 7 and 14 days at 55° C., with the results recorded in Table 6 below.

Working Curve Measurement

Working curve data ($E_c$, $D_p$, and $E_{10}$) was prepared using a solid state laser operating at a wavelength of 354.7 nm in accordance with the below method.

The working curve is a measure of the photospeed of the particular material. It represents the relationship between the thickness of a layer of liquid radiation curable resin produced as a function of the exposure given. For all formulations, the exposure-working curve of the formula is determined using methods well known in the art.

The exposure response for each formulation is measured using a 21.7 g sample of the formulation in a 100 mm diameter petri dish held at 30° C. and 30% RH. The surface of the formulation is exposed with the indicated light source. The exposures are made in half-inch squares (exposure regions) which are scanned out by drawing consecutive parallel lines approximately 25.4 microns apart on the surface of the liquid in the petri dish at 72 mW. Different exposure regions are exposed to different levels of known incident energy to obtain different cured thicknesses. The spot diameter at the liquid surface is approximately 0.0277 cm in diameter. After waiting at least 15 minutes for the exposed panels to harden, the panels are removed from the petri dish and excess, uncured resin is removed by blotting with a Kimwipe EX-L (Kimberly Clark). Film thickness is measured with a Mitutoyo Model ID-C 1 12CE Indicator Micrometer. Film thickness is a linear function of the natural logarithm of the exposure energy; the slope of the regression is $D_p$ (units of micron or mil) and $E_c$ is the x-axis intercept of the regression fit (units of $mJ/cm^2$). $E_{10}$ is the energy required to cure a ten mil (254 micron) layer.

TABLE 6

| Component | Ex. 30 | Ex. 31 |
|---|---|---|
| Nanopox A 610 | 34.61 | |
| Dispersion of Example 29 | | 34.61 |
| Erysis GE-20 | 7.5 | 7.5 |
| SR-351 | 3.36 | 3.36 |
| DPHA | 2.07 | 2.07 |
| Irgacure 184 | 0.4 | 0.4 |
| Chivacure 1176 | 3.8 | 3.8 |
| 4-methoxyphenol | 0.02 | 0.02 |
| Aerosil 200 | 0.22 | 0.22 |
| Sunspacer 04.X | 47.87 | 47.87 |
| DG-0071 | 0.15 | 0.15 |
| Total | 100.00 | 100.00 |
| Total fillers | 61.71 | 61.71 |
| Ec (mJ/cm2) | 12.22 | 10.86 |
| Dp (mils) | 5.15 | 4.75 |
| $E_{10}$ (mJ/cm2) | 85 | 89.1 |
| Initial Viscosity (30° C., cps) | 2282 | 1306 |
| Viscosity (30° C., cps) (55° C., 7 days) | 3899 | 1835 |
| Viscosity (30° C., cps) (55° C., 14 days) | 5405 | 2034 |

Discussion of Results

Examples 1-31 are matrix filled liquid radiation curable resin compositions demonstrating increased suitability for additive fabrication. It is apparent from Tables 2 and 3 that the ratio of the microparticle constituent to the nanoparticle constituent (by weight and/or volume), is critical to creating filled matrices which can resist the hard pack settling phenomenon. Particularly, it is noted that below approximately a 12:1 weight or volume ratio of the microparticle constituent to nanoparticle constituent, filled matrices display a surprisingly improved tendency to withstand disintegration into a hard pack. The hard pack phenomenon is similarly evident in Examples 11 and 12, wherein the nanoparticle constituent is removed from the filled matrix entirely. Thus, in an embodiment of the present invention, the presence of both a nanoparticle constituent and a microparticle constituent is necessary to prevent unwanted hard pack phase separation.

Furthermore, Examples 1-20 demonstrate that when the ratio by number of the nanoparticles present in the nanoparticle constituent to the microparticles present in the microparticle constituent becomes too large, the filled matrix can possess an undesirably high viscosity and quickly break down into a soft pack. Particularly, it is hypothesized, drawing upon support from the Examples in Tables 2 and 3, that filled matrices become unwieldy and break down into a soft pack when the ratio of nanoparticles present in the nanoparticle constituent to the number of microparticles present in the microparticle constituent is exceeds about 1,000,000:1.

Additionally, Examples 21-31 demonstrate the effect that both the particle dispersion pH and the particle size of the filled particle dispersion have on the resulting liquid radiation curable composition's thermal stability. It is surmised from an extrapolation of the data in Tables 4-5 that below a particle dispersion pH of about 5.5, the acidic filled particle dispersion imparts poor thermal stability into the photocurable composition for additive fabrication into which it is incorporated, such that even a routine solvent exchange is impractical. Furthermore, from Table 6, it is shown that compositions possessing a nanoparticle constituent with nanoparticles having an average particle size of above 50 nm exhibit improved thermal stability versus those having nanoparticles with an average size of below 50 nm, even where the particle dispersion pH is in an otherwise acceptable range.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventor for carrying out the invention. Variations of those preferred embodiments may become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

While the invention has been described in detail and with reference to specific embodiments thereof, it will be apparent to one of ordinary skill in the art that various changes and modifications can be made therein without departing from the spirit and scope of the claimed invention.

What is claimed is:

1. A liquid radiation curable composition for additive fabrication comprising:
   (a) a cationically polymerizable aliphatic epoxide;
   (b) a multifunctional (meth)acrylate component;
   (c) a cationic photoinitiator;
   (d) a free-radical photoinitiator; and
   (e) a filled matrix comprising a nanoparticle constituent comprising
   a plurality of inorganic nanoparticles, and a microparticle constituent comprising a plurality of inorganic microparticles;
   wherein the ratio by weight of the microparticle constituent to the nanoparticle constituent is from about 1:1 to about 12:1; and
   wherein the ratio of the average particle size of the inorganic microparticles in the microparticle constituent to the average particle size of the inorganic nanoparticles in the nanoparticle constituent is from about 2.41:1 to about 200:1 less than 200:1.

2. The liquid radiation curable composition for additive fabrication of claim 1, wherein
   the inorganic nanoparticles of the nanoparticle constituent have an average particle size of from about 50 nanometers to about 100 nanometers; and
   the inorganic microparticles of the microparticle constituent have an average particle size of from about 2 microns to about 8 microns.

3. The liquid radiation curable composition for additive fabrication of claim 2, wherein at least one of the microparticle constituent or the nanoparticle constituent comprises spherical particles selected from the group consisting of ceramics, glass, and metal.

4. The liquid radiation curable composition for additive fabrication of claim 3, wherein
   the ratio by weight of the microparticle constituent to the nanoparticle constituent is from about 4:1 to about 8:1; and
   the ratio of the average particle size of the inorganic microparticles in the microparticle constituent to the average particle size of the inorganic nanoparticles in the nanoparticle constituent is from about 6.46:1 to about 100:1.

5. The liquid radiation curable composition for additive fabrication claim 4, wherein the aliphatic epoxide component is a cycloaliphatic epoxy selected from the group consisting of: 3,4-epoxycyclohexylmethyl-3',4'-epoxycyclohexanecarboxylate, 2-(3,4-epoxycyclohexyl-5,5-spiro-3,4-epoxy)-cyclohexane-1,4-dioxane, bis(3,4-epoxycyclohexylmethyl) adipate, vinylcyclohexene oxide, 4-vinylepoxycyclohexane, vinylcyclohexene dioxide, bis(3,4-epoxy-6-methylcyclohexylmethyl)adipate, 3,4-epoxy-6-methylcyclohexyl-3',4'-epoxy-6'-methylcyclohexanecarboxylate, ε-caprolactone-modified 3,4-epoxycyclohexylmethyl-3',4'-epoxycyclohexane carboxylates, trimethylcaprolactone-modified 3,4-epoxycyclohexylmethyl-3',4'-epoxycyclohexane carboxylates, β-methyl-δ-valerolactone-modified 3,4-epoxycyclohexcylmethyl-3',4'-epoxycyclohexane carboxylates, methylenebis(3,4-epoxycyclohexane), bicyclohexyl-3,3'-epoxide, bis(3,4-epoxycyclohexyl) with a linkage of —O—, —S—, —SO—, —SO$_2$—, —C(CH$_3$)$_2$—, —CBr$_2$—, —C(CBr$_3$)$_2$—, —C(CF$_3$)$_2$—, —C(CCl$_3$)$_2$—, or —CH(C$_6$H$_5$)—, dicyclopentadiene diepoxide, di(3,4-epoxycyclohexylmethyl) ether of ethylene glycol, ethylenebis(3,4-epoxycyclohexanecarboxylate), and epoxyhexahydrodioctylphthalate.

6. The liquid radiation curable composition for additive fabrication of claim 5, wherein the ratio by volume of the microparticle constituent to the nanoparticle constituent is from about 1:1 to about 12:1.

7. The liquid radiation curable composition for additive fabrication of claim 6, wherein the ratio by number of the inorganic nanoparticles in the nanoparticle constituent to the inorganic microparticles in the microparticle constituent is from about 50:1 to about 1,000,000:1.

8. The liquid radiation curable composition for additive fabrication of claim 7, wherein the ratio by number of the inorganic nanoparticles in the nanoparticle constituent to the inorganic microparticles in the microparticle constituent is from about 5,000:1 to about 50,000:1.

9. The liquid radiation curable composition for additive fabrication of claim 7, wherein, relative to the total weight of the entire composition:

component (a) is present in an amount of from about 10 wt % to about 30 wt %;

component (b) is present in an amount of from about 2 wt % to about 10 wt %;

component (c) is present in an amount of from about 1 wt % to about 10 wt %;

component (d) is present in an amount of from about 0.1 wt % to about 5 wt %; and component (e) is present in an amount of from about 30 wt % to about 80 wt %.

10. The liquid radiation curable composition for additive fabrication of claim 9, further comprising a multifunctional glycidyl ether that is devoid of cyclohexane groups.

11. The liquid radiation curable composition for additive fabrication of claim 10, wherein the multifunctional glycidyl ether that is devoid of cyclohexane groups is a neopentyl glycol diglycidyl ether.

12. The liquid radiation curable composition for additive fabrication of claim 11 further comprising an oxetane, and wherein component (c) is an R-substituted aromatic thioether triaryl sulfonium or iodonium tetrakis(pentafluorophenyl) borate cationic photoinitiator with a tetrakis(pentafluorophenyl)borate anion and a cation of the following formula (I):

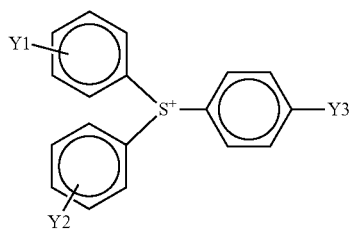

wherein Y1, Y2, and Y3 are the same or different and wherein Y1, Y2, or Y3 are R-substituted aromatic thioether with R being an acetyl or halogen group.

13. The liquid radiation curable composition of claim 11 further comprising an oxetane, wherein component (c) possesses an anion represented by $SbF_6^-$, $PF_6^-$, $BF_4^-$, $(CF_3CF_2)_3PF_3^-$, $(C_6F_5)_4B^-$, $((CF_3)_2C_6H_3)_4B^-$, $(C_6F_5)_4Ga^-$, $((CF_3)_2C_6H_3)_4Ga^-$, trifluoromethanesulfonate, nonafluorobutanesulfonate, methanesulfonate, butanesulfonate, benzenesulfonate, or p-toluenesulfonate, and a cation of the following formula (II):

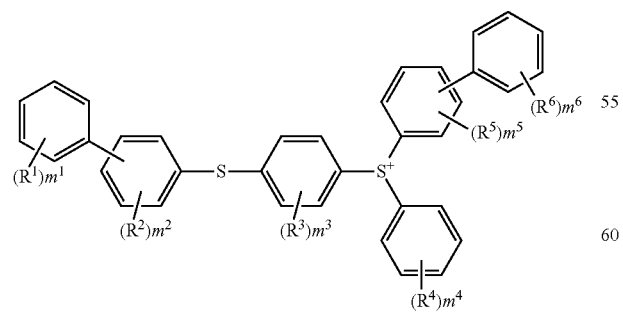

wherein in formula (II), $R^1$, $R^2$, $R^3$, $R^5$ and $R^6$ each independently represent an alkyl group, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group, or a halogen atom, $R^4$ represents an alkyl group, a hydroxy group, an alkoxy group, an alkylcarbonyl group, an alkoxycarbonyl group, an acyloxy group, an alkylthio group, a heterocyclic hydrocarbon group, an alkylsulfinyl group, an alkylsulfonyl group, a hydroxy(poly)alkyleneoxy group, an optionally substituted amino group, a cyano group, a nitro group, or a halogen atom, $m^1$ to $m^6$ each represent the number of occurrences of each of $R^1$ to $R^6$, $m^1$, $m^4$, and $m^6$ each represent an integer of 0 to 5, and $m^2$, $m^3$, and $m^5$ each represent an integer of 0 to 4.

14. The liquid radiation curable composition for additive fabrication of claim 11, wherein the composition has a viscosity of between about 600 cPs and about 1200 cPs, and after full cure with actinic radiation and 60 min UV and thermal postcure, has the following properties:
(a) a heat distortion temperature at 1.82 MPa of between about 80 degrees C. and about 120 degrees C., and
(b) a flexural modulus of between about 8,000 MPa and about 12,000 MPa.

15. The liquid radiation curable composition of claim 11, further comprising a second aliphatic epoxide component, and wherein
the microparticle constituent consists of colloidal silica microparticles,
and the nanoparticle constituent consists of colloidal silica nanoparticles.

16. A process of forming a three-dimensional object comprising the steps of forming and selectively curing a layer of the liquid radiation curable resin composition for additive fabrication of claim 1 with actinic radiation and repeating the steps of forming and selectively curing a layer of the liquid radiation curable resin composition for additive fabrication of claim 1 a plurality of times to obtain a three-dimensional object.

17. The process of claim 16 wherein the source of actinic radiation is one or more LEDs emitting a wavelength of from 340 nm-415 nm, preferably having a peak at about 365 nm.

18. A three-dimensional object formed by the process of claim 16.

19. A liquid radiation curable composition for additive fabrication comprising:
(a) a cationically polymerizable component;
(b) a (meth)acrylate component;
(c) a cationic photoinitiator;
(d) a free-radical photoinitiator;
(e) a filled matrix, further comprising
a filled particle dispersion containing a nanoparticle constituent made up of a plurality of silica nanoparticles having an average particle size of at least about 50 nanometers, and a solvent, and a microparticle constituent made up of a plurality of inorganic microparticles; wherein the ratio by weight of the microparticle constituent to the nanoparticle constituent is from about 1:1 to about 12:1, wherein the ratio of an average particle size of the inorganic microparticles in the microparticle constituent to an average particle size of the silica nanoparticles in the nanoparticle constituent is from about 2.41:1 to less than 200:1, and wherein the filled particle dispersion has a particle dispersion pH of greater than about 5.5.

20. The liquid radiation curable composition for additive fabrication of claim 19, wherein
said plurality of silica nanoparticles have an average particle size of from about 50 nanometers to about 100 nanometers;
said plurality of inorganic microparticles have an average particle size of from about 0.2 microns to 20 microns; and
wherein the particle dispersion pH of the filled particle dispersion is from 6.0 to about 7.5.

21. The liquid radiation curable composition for additive fabrication of claim 20, wherein the filled matrix is present in an amount by weight, relative to the entire composition, of from about 50 wt % to about 70 wt %.

22. The liquid radiation curable composition for additive fabrication of claim 21, wherein
the ratio of the average particle size of the inorganic microparticles in the microparticle constituent to the average particle size of the silica nanoparticles in the nanoparticle constituent is from about 6.46:1 to about 100:1; and
the ratio by weight of the microparticle constituent to the nanoparticle constituent is from about 4:1 to about 8:1.

23. The liquid radiation curable composition for additive fabrication of claim 22, wherein the solvent is selected from one or more of the group consisting of methyl ethyl ketone, isopropanol, an epoxide, an oxetane, and an acrylate.

24. The liquid radiation curable composition for additive fabrication of claim 23, wherein the solvent is a 3,4-epoxycyclohexylmethyl 3',4'-epoxycyclohexanecarboxylate.

25. The liquid radiation curable composition for additive fabrication of claim 24, wherein component (c) is an R-substituted aromatic thioether triaryl sulfonium or iodonium tetrakis(pentafluorophenyl) borate cationic photoinitiator with a tetrakis(pentafluorophenyl)borate anion and a cation of the following formula (I):

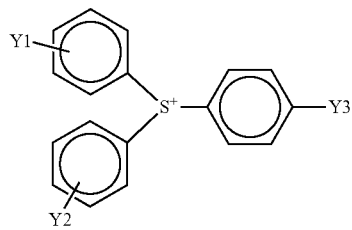

I wherein Y1, Y2, and Y3 are the same or different and wherein Y1, Y2, or Y3 are R-substituted aromatic thioether with R being an acetyl or halogen group.

26. The liquid radiation curable composition for additive fabrication of claim 24, wherein component (c) is a fluoroalkyl-substituted fluorophosphate with a cation of the following general formula (II):

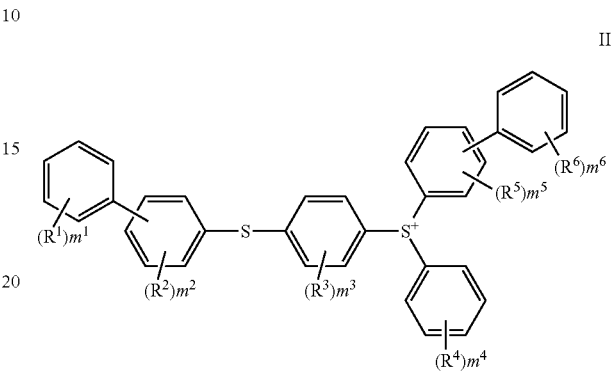

II wherein $R^1$, $R^2$, $R^3$, $R^5$ and $R^6$ each independently represent an alkyl group, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group, or a halogen atom, $R^4$ represents an alkyl group, a hydroxy group, an alkoxy group, an alkylcarbonyl group, an alkoxycarbonyl group, an acyloxy group, an alkylthio group, a heterocyclic hydrocarbon group, an alkylsulfinyl group, an alkylsulfonyl group, a hydroxy(poly)alkyleneoxy group, an optionally substituted amino group, a cyano group, a nitro group, or a halogen atom, $m^1$ to $m^6$ each represent the number of occurrences of each of $R^1$ to $R^6$, $m^1$, $m^4$, and $m^6$ each represent an integer of 0 to 5, and $m^2$, $m^3$, and $m^5$ each represent an integer of 0 to 4.

* * * * *

UNITED STATES PATENT AND TRADEMARK OFFICE
CERTIFICATE OF CORRECTION

| | | |
|---|---|---|
| PATENT NO. | : 9,228,073 B2 | Page 1 of 1 |
| APPLICATION NO. | : 14/533238 | |
| DATED | : January 5, 2016 | |
| INVENTOR(S) | : Mingo He et al. | |

It is certified that error appears in the above-identified patent and that said Letters Patent is hereby corrected as shown below:

IN THE CLAIMS

Claim 1

In Column 42, line 5, "about 200:1 less than 200:1", should read

--- less than 200:1 ---

Signed and Sealed this
Twenty-sixth Day of April, 2016

Michelle K. Lee
*Director of the United States Patent and Trademark Office*